(12) United States Patent
Park et al.

(10) Patent No.: US 9,093,500 B2
(45) Date of Patent: Jul. 28, 2015

(54) METHODS OF FORMING SEMICONDUCTOR DEVICE USING BOWING CONTROL LAYER

(71) Applicants: Jae-Hong Park, Seongnam-si (KR);
Min-Joon Park, Yongin-si (KR);
Jun-Ho Yoon, Suwon-si (KR);
Gyung-Jin Min, Seongnam-si (KR);
Jin-Young Park, Anyang-si (KR);
Je-Woo Han, Hwasung-si (KR)

(72) Inventors: Jae-Hong Park, Seongnam-si (KR);
Min-Joon Park, Yongin-si (KR);
Jun-Ho Yoon, Suwon-si (KR);
Gyung-Jin Min, Seongnam-si (KR);
Jin-Young Park, Anyang-si (KR);
Je-Woo Han, Hwasung-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/247,635

(22) Filed: Apr. 8, 2014

(65) Prior Publication Data

US 2015/0056805 A1    Feb. 26, 2015

(30) Foreign Application Priority Data

Aug. 23, 2013  (KR) .......................... 10-2013-0100645

(51) Int. Cl.
*H01L 21/311* (2006.01)
*H01L 21/768* (2006.01)

(52) U.S. Cl.
CPC ................................ *H01L 21/76802* (2013.01)

(58) Field of Classification Search
CPC ............ H01L 21/446; H01L 21/76831; H01L 21/76205; H01L 21/76224; H01L 21/76843; H01L 27/0727; H01L 27/0794; H01L 27/0924; H01L 29/517; H01L 29/518; H01L 21/46; H01L 29/5187; H01L 21/28079; H01L 21/475; H01L 21/0362; H01L 21/02129; H01L 29/1434

USPC ......... 438/700, 637, 381, 501, 504, 505, 508, 438/510, 532, 553, 668, 672, 734, 735, 706, 438/720, 754, 786, 942; 257/E21.006, 257/E21.008, E21.023, E21.126, E21.127, 257/E21.154, E21.158, E21.229, E21.245, 257/E21.267, E21.278, E21.293, E21.314, 257/E21.32, E21.396, E21.545, E21.546, 257/E21.564, E21.577

See application file for complete search history.

(56) References Cited

U.S. PATENT DOCUMENTS 7,862,990 B2 *    1/2011  Yoon et al. .................... 430/323
2011/0294276 A1 * 12/2011  Kuroki .......................... 438/381

FOREIGN PATENT DOCUMENTS

| JP | 2011-249583 A | 12/2011 |
| KR | 10-2005-0010247 A | 1/2005 |
| KR | 10-0807082 B1 | 2/2008 |
| KR | 10-2008-0104902 A | 12/2008 |

* cited by examiner

*Primary Examiner* — David Nhu
(74) *Attorney, Agent, or Firm* — Myers Bigel Sibley & Sajovec, P.A.

(57) ABSTRACT

A bowing control pattern is formed on an intermediate layer. A hardmask pattern is formed on the bowing control layer. The hardmask pattern has a first opening, and the bowing control pattern has a second opening. A third opening passes through the intermediate layer and is connected to the second opening. The bowing control pattern includes first and second edges on a lower end of the second opening, and a third edge on an upper end of the second opening. When a first point on the first edge, a second point on the second edge, and a third point on a horizontal line passing through the third edge are defined, an intersecting angle between a first side from the first point to the second point, and a second side from the second point to the third point is from about 50° to about 80°.

25 Claims, 40 Drawing Sheets

METHODS OF FORMING SEMICONDUCTOR DEVICE USING BOWING CONTROL LAYER

CROSS-REFERENCE TO RELATED APPLICATION

This application claims priority under 35 U.S.C. §119 to Korean Patent Application No. 10-2013-0100645 filed on Aug. 23, 2013, the disclosure of which is hereby incorporated by reference in its entirety.

BACKGROUND

1. Field

Embodiments of the inventive concepts relate to methods of forming a semiconductor device having high aspect ratio structures, and related devices.

2. Description of Related Art

As the integration of a semiconductor device increases, various methods are being studied in order to efficiently perform a process of patterning a structure having an aspect ratio of about 20:1 or more.

SUMMARY

Embodiments of the inventive concepts provide a method of forming a semiconductor device that requires a process of patterning a layer having a high aspect ratio.

Other embodiments of the inventive concepts provide a mask pattern which is applicable to a process of patterning a high aspect ratio structure.

Still other embodiments of the inventive concepts provide a semiconductor device including a pattern having a high aspect ratio.

The technical objectives of the inventive concepts are not limited to the above disclosure; other objectives may become apparent to those of ordinary skill in the art based on the following descriptions.

In accordance with an aspect of the inventive concepts, a method of forming a semiconductor device includes forming an intermediate layer on a substrate, forming a bowing control layer on the intermediate layer, forming a hardmask pattern having a thickness of about 0.17 times the intermediate layer or less on the bowing control layer, and forming a third opening passing through the intermediate layer and connected to the second opening and having an aspect ratio of about 20:1 or more. The hardmask pattern has a first opening, and the bowing control layer has a second opening connected to the first opening. The bowing control layer comprises a different material from the hardmask pattern, and includes a first edge on a lower end of the second opening, a second edge on the lower end of the second opening and facing the first edge, and a third edge on an upper end of the second opening. When a first point on the first edge, a second point on the second edge, and a third point located on a horizontal line passing through the third edge are defined, an intersecting angle between a first side from the first point to the second point, and a second side from the second point to the third point is from about 50° to about 80° when an intersecting angle between the first side and a third side from the first point to the third point is about 90°.

In some embodiments, when first to fourth quartiles are defined on a sidewall of the third opening, a straight line passing the first quartile and the third quartile may be spaced apart from the fourth quartile, and the fourth quartile is located on an upper edge of the intermediate layer.

In other embodiments, a distance between the fourth quartile and the straight line may be about 0.05 times a width of the third opening or less.

In still other embodiments, when first to fourth quartiles are defined on a sidewall of the third opening, a first straight line passing the first quartile and the third quartile may be in contact with the fourth quartile, and the fourth quartile is located on an upper edge of the intermediate layer.

In still other embodiments, the bowing control layer may include a material having an opposite stress to the hardmask pattern.

In still other embodiments, the hardmask pattern may include a W layer, and the bowing control layer may include a Ti layer, a TiN layer, a Ta layer, an AlN layer, an AlO layer, a TaO layer, an undoped Si layer and/or a doped Si layer.

In still other embodiments, the hardmask pattern may include a Ti layer, a TiN layer, an AlN layer, an AlO layer and/or a TaO layer, and the bowing control layer may include an undoped Si layer and/or a doped Si layer.

In still other embodiments, the hardmask pattern may include a C-doped Si layer and/or a B-doped Si layer, and the bowing control layer may include a W layer, a TiN layer and/or an undoped Si layer.

In still other embodiments, the bowing control layer may include a different material from an uppermost layer of the intermediate layer.

In still other embodiments, the thickness of the hardmask pattern may be about 0.01 to about 0.17 times that of the intermediate layer.

In still other embodiments, the intermediate layer may include two or more alternately stacked different materials.

In still other embodiments, the forming of the bowing control layer and the hardmask pattern may include forming the bowing control layer on the intermediate layer, forming a hardmask layer on the bowing control layer, forming a mask layer on the hardmask layer, forming a photoresist pattern on the mask layer, forming a mask pattern by patterning the mask layer using the photoresist pattern, removing the photoresist pattern, and sequentially patterning the hardmask layer and the bowing control layer using the mask pattern.

In still other embodiments, a plug may be formed in the third opening.

In accordance with another aspect of the inventive concepts, a method of forming a semiconductor device includes forming an intermediate layer on a substrate, forming a bowing control layer on the intermediate layer, forming a hardmask pattern having a thickness of about 0.17 times the intermediate layer or less on the bowing control layer, and forming a third opening passing through the intermediate layer, connected to the second opening and having an aspect ratio of about 20:1 or more. The hardmask pattern has a first opening, and the bowing control layer has a second opening connected to the first opening. The bowing control pattern has a different material from the hardmask pattern, and includes a material having an opposite stress to the hardmask pattern. The hardmask pattern comprises a W layer, a Ti layer, a TiN layer, an AlN layer, an AlO layer, a TaO layer, a C-doped Si layer, and/or a B-doped Si layer. The bowing control pattern comprises a Ti layer, a TiN layer, a Ta layer, an AlN layer, an AlO layer, a TaO layer, an undoped Si layer, a doped Si layer, and/or a W layer.

In some embodiments, the bowing control layer may include a first edge on a lower end of the second opening, a second edge on the lower end of the second opening and facing the first edge, and a third edge on an upper end of the second opening. When a first point on the first edge, a second point on the second edge, and a third point located on a horizontal line passing through the third edge are defined, an intersecting angle between a first side from the first point to the second point, and a second side from the second point to the third point may be from about 50° to about 80° when an intersecting angle between the first side and a third side from the first point to the third point is about 90°.

In accordance with still another aspect of the inventive concepts, a method of forming a semiconductor device includes forming an intermediate layer on a substrate, forming a bowing control layer on the intermediate layer, forming a hardmask layer having a thickness of about 0.17 times the intermediate layer or less on the bowing control layer, forming a capping mask pattern on the hardmask layer by a first etching process, forming a hardmask pattern having a first opening, and a bowing control pattern having a second opening connected to the first opening by a second etching process on the hardmask layer and the bowing control layer, respectively, using the capping mask pattern as an etch mask, and forming a third opening passing through the intermediate layer, connected to the second opening and having an aspect ratio of about 20:1 or more by a third etching process. The bowing control pattern comprises a different material from the hardmask pattern.

In some embodiments, the second etching process may be performed in a different chamber from the first etching process. The third etching process may be performed in a different chamber from the second etching process.

In other embodiments, the bowing control layer may include a material having an opposite stress to the hardmask layer.

In still other embodiments, the hardmask layer may comprises a W layer, a Ti layer, a TiN layer, an AlN layer, an AlO layer, a TaO layer, a C-doped Si layer, and/or a B-doped Si layer. The bowing control pattern may comprise a Ti layer, a TiN layer, a Ta layer, an AlN layer, an AlO layer, a TaO layer, an undoped Si layer, a doped Si layer, and/or a W layer.

In still other embodiments, the bowing control pattern may include a first edge on a lower end of the second opening, a second edge on the lower end of the second opening and facing the first edge, and a third edge on an upper end of the second opening. When a first point on the first edge, a second point on the second edge, and a third point located on a horizontal line passing through the third edge are defined, an intersecting angle between a first side from the first point to the second point, and a second side from the second point to the third point may be from about 50° to about 80° when an intersecting angle between the first side and a third side from the first point to the third point is about 90°.

In accordance with still another aspect of the inventive concepts, a semiconductor device includes an intermediate layer on a substrate, and a contact hole passing through the intermediate layer and having an aspect ratio of about 20:1 or more. When first to fourth quartiles are defined on a sidewall of the contact hole, the fourth quartile is located on an upper edge of the contact hole, and a straight line passing the first quartile and the third quartile is spaced apart from the fourth quartile. A distance between the fourth quartile and the straight line is about 0.05 times a width of the contact hole or less.

In some embodiments, the semiconductor device may further include a conductive plug in the contact hole. The first to fourth quartiles may be in contact with the conductive plug, and a distance between the fourth quartile and the straight line may be about 0.05 times a width of the conductive plug or less.

In other embodiments, the semiconductor device may further include a lower electrode in the contact hole, an upper electrode disposed on the lower electrode, a capacitor dielectric layer disposed between the lower electrode and the upper electrode, a drain area on the substrate, and a buried contact plug disposed between the drain area and the lower electrode.

In still other embodiments, the semiconductor device may further include a conductive pattern in the contact hole, and a data storage element. The intermediate layer may include a plurality of vertically stacked gate electrodes. The contact hole may pass through the gate electrodes. The data storage element may be disposed between the conductive pattern and the gate electrodes.

In still other embodiments, the data storage element may include a charge trapping dielectric layer, a resistance-change layer, a phase-change layer, a magnetic tunnel junction (MTJ), a polymer layer and/or or ferroelectrics.

In still other embodiments, method analogs of the semiconductor device described above may be provided. Thus, for example, various embodiments of the inventive concepts can provide forming an intermediate layer on a substrate, and forming a contact hole passing through the intermediate layer and having an aspect ratio of about 20:1 or more, such that when first to fourth quartiles are defined on a sidewall of the contact hole, the fourth quartile is located on an upper edge of the contact hole, and a straight line passing the first quartile and the third quartile is spaced apart from the fourth quartile, a distance between the fourth quartile and the straight line is about 0.05 times a width of the contact hole or less.

Details of other embodiments are included in the detailed description and drawings.

BRIEF DESCRIPTION OF THE DRAWINGS

The foregoing and other features and advantages of the inventive concepts will be apparent from the more particular description of preferred embodiments of the inventive concepts, as illustrated in the accompanying drawings in which like reference numerals denote the same respective parts throughout the different views. The drawings are not necessarily to scale, emphasis instead being placed upon illustrating the principles of the inventive concepts. In the drawings.

DETAILED DESCRIPTION OF THE EMBODIMENTS

Figure 1:
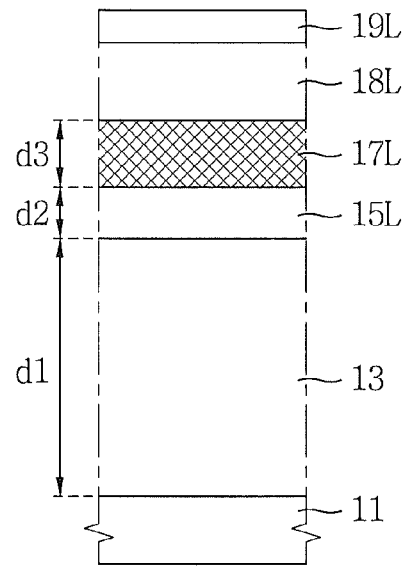
FIGS. 1, 2A, and 3 to 39 are cross-sectional views for describing methods of fabricating semiconductor devices, and resulting semiconductor devices, in accordance with embodiments of the inventive concepts.

Various embodiments will now be described more fully with reference to the accompanying drawings in which some embodiments are shown. These inventive concepts may, however, be embodied in different forms and should not be construed as limited to the embodiments set forth herein. Rather, these embodiments are provided so that this disclosure is thorough and complete and fully conveys the inventive concepts to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. In the following explanation, the same reference numerals denote the same components throughout the specification.

It will be understood that, although the terms first, second, A, B, etc. may be used herein in reference to elements of the invention, such elements should not be construed as limited by these terms. For example, a first element could be termed a second element, and a second element could be termed a first element, without departing from the scope of the present invention. Herein, the term "and/or" includes any and all combinations and subcombinations of one or more referents.

Spatially relative terms, such as "beneath," "below," "lower," "above," "upper," and the like may be used herein to describe the relationship of one element or feature to another, as illustrated in the drawings. It will be understood that such descriptions are intended to encompass different orientations in use or operation in addition to orientations depicted in the drawings. For example, if a device is turned over, elements described as "below" or "beneath" other elements or features would then be oriented "above" the other elements or features. Thus, the term "below" is intended to mean both above and below, depending upon overall device orientation.

The terminology used herein to describe embodiments of the invention is not intended to limit the scope of the invention. The articles "a," "an," and "the" are singular in that they have a single referent; however, the use of the singular form in the present document should not preclude the presence of more than one referent. In other words, elements of the invention referred to in the singular may number one or more, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein are to be interpreted as is customary in the art to which this invention belongs. It will be further understood that terms in common usage should also be interpreted as is customary in the relevant art and not in an idealized or overly formal sense unless expressly so defined herein.

Figure 2A:
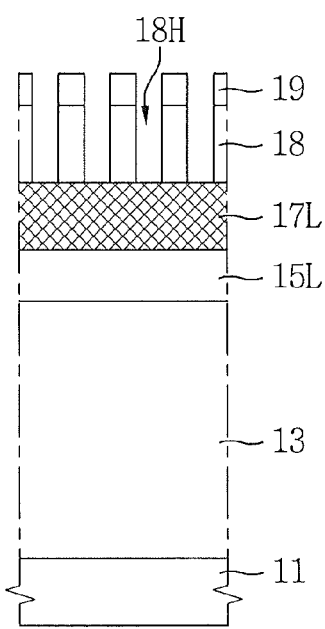
Figure 2B:
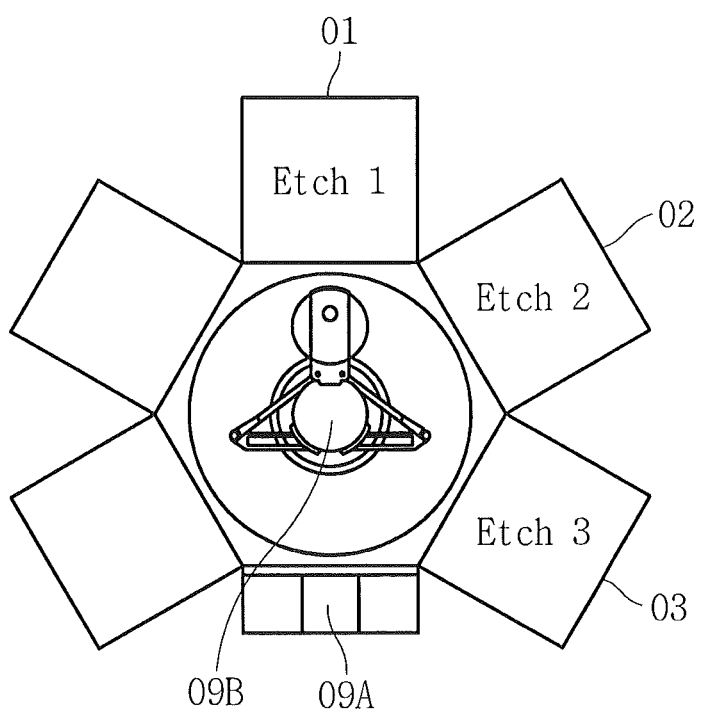
FIG. 2B is a schematic diagram for describing a semiconductor manufacturing apparatus applicable to embodiments of the inventive concepts.

FIGS. 1, 2A, and 3 to 11B are cross-sectional views for describing methods of fabricating a semiconductor device in accordance with embodiments of the inventive concepts, and resulting semiconductor devices, and FIG. 2B is a schematic diagram for describing a semiconductor manufacturing apparatus applicable to embodiments of the inventive concepts.

Referring to FIG. 1, an interlayer insulating layer 13 may be formed on a substrate 11. The interlayer insulating layer 13 may have a first thickness d1. A bowing control layer 15L may be formed on the interlayer insulating layer 13. The bowing control layer 15L may have a second thickness d2. A hardmask layer 17L may be formed on the bowing control layer 15L. The hardmask layer 17L may have a third thickness d3. A first mask layer 18L may be formed on the hardmask layer 17L. A second mask layer 19L may be formed on the first mask layer 18L.

The substrate 11 may be a semiconductor substrate, such as a silicon wafer or a silicon-on-insulator (SOI) wafer. The interlayer insulating layer 13 may include silicon oxide, silicon nitride and/or silicon oxynitride. The interlayer insulating layer 13 may be a single layer or a multiple layer. A plurality of active/passive devices may be formed inside or between the substrate 11 and the interlayer insulating layer 13; however, detailed descriptions are omitted here for brevity. The interlayer insulating layer 13 may be referred to as an intermediate layer.

The bowing control layer 15L may cover the interlayer insulating layer 13, with a uniform thickness. The hardmask layer 17L may cover the bowing control layer 15L, with a uniform thickness. The hardmask layer 17L may include a different material layer from the interlayer insulating layer 13. The hardmask layer 17L may include W, Ta, Ti, Al, WO, TaO, TiO, AlO, WN, TaN, TiN, AlN, WC, TaC, TiC, AlC, WCN, TaCN, TiCN, AlCN, C-doped Si and/or B-doped Si. The C-doped Si and the B-doped Si may have a doping concentration of about 10% or more. The hardmask layer 17L may include a material having a high etch selectivity with respect to the interlayer insulating layer 13.

For example, the hardmask layer 17L may include a material having an etch selectivity of about 6:1 to about 100:1 with respect to the interlayer insulating layer 13. The thickness of the hardmask layer 17L may be smaller than that of the interlayer insulating layer 13. The ratio of the first thickness d1 of the interlayer insulating layer 13 to the third thickness d3 of the hardmask layer 17L may be about 6:1 to about 100:1. The thickness of the hardmask layer 17L may be about 0.01 to about 0.17 times that of the interlayer insulating layer 13. The hardmask layer 17L may have a thickness of about 100 nm to about 200 nm. The hardmask layer 17L may include a W layer.

The bowing control layer 15L may include a different material layer from the interlayer insulating layer 13 and the hardmask layer 17L. The bowing control layer 15L may include an undoped Si, a doped Si, an amorphous carbon layer (ACL), a doped ACL, silicon oxide, silicon nitride, W, Ta, Ti, Al, WO, TaO, TiO, AlO, WN, TaN, TiN, AlN, WC, TaC, TiC, AlC, WCN, TaCN, TiCN, AlCN, C-doped Si and/or B-doped Si. The bowing control layer 15L may include a material having opposite stress characteristics to the hardmask layer 17L. The bowing control layer 15L may serve to compensate stress of the hardmask layer 17L. The bowing control layer 15L may include a material having an etch selectivity with respect to the interlayer insulating layer 13.

For example, when the hardmask layer 17L is a material having tensile stress, the bowing control layer 15L may be a material having compressive stress. When the hardmask layer 17L is a material having compressive stress, the bowing control layer 15L may be a material having tensile stress. In some embodiments, the hardmask layer 17L may include a W layer, and the bowing control layer 15L may include a Ti layer, a TiN layer, a Ta layer, an AlN layer, an AlO layer, a TaO layer, an undoped Si layer and/or a doped Si layer. In other embodiments, the hardmask layer 17L may include a Ti layer, a TiN layer and/or an AlN layer, and the bowing control layer 15L may include an undoped Si layer and/or a doped Si layer. In yet other embodiments, the hardmask layer 17L may include an AlO layer and/or an TaO layer, and the bowing control layer 15L may include an undoped Si layer and/or a doped Si layer. In still other embodiments, the hardmask layer 17L may include a C-doped Si layer and/or a B-doped Si layer, and the bowing control layer 15L may include a W layer, a TiN layer and/or an undoped Si layer.

The first mask layer 18L may include a different material from the hardmask layer 17L and the bowing control layer 15L. For example, the first mask layer 18L may include silicon oxide. The second mask layer 19L may include a different material from the first mask layer 18L. For example, the second mask layer 19L may include a photoresist layer.

Various embodiments described herein may arise from recognition that, as the integration of a semiconductor device increases, it may be desirable to efficiently perform a process of patterning a structure having an aspect ratio of about 20:1 or more. For example, in a process, such as a one-cylinder-stack (OCS) etching process for forming a capacitor structure of a DRAM, a channel hole etching process in a vertical NAND flash, and a metal contact etching process, etch thicknesses are increasing, and contact sizes are decreasing. In order to respond to the increase of etch thickness, a thickness of a hardmask may increase, however, this may make it difficult to reduce the contact sizes and may cause poor patterning of the hardmask. Moreover, if the hardmask is not sufficiently thick, the hardmask may be used up before being etched to a desired depth. Accordingly, application of a hardmask having a high etch selectivity, such as W, is being studied. A thickness of the hardmask having a high etch selectivity can be significantly reduced compared to that of the hardmask in the related art. Unfortunately, however, when etching a contact hole having a high aspect ratio of about 20:1 or more, the hardmask having a high etch selectivity may generate top bowing in an upper area of the contact hole, and therefore, it may be difficult to obtain a desired contact profile.

In sharp contrast, according to various embodiments of the inventive concepts, a profile of an opening having a high aspect ratio of 20:1 or more may be very efficiently controlled using a combination of a bowing control pattern and a hardmask pattern. The thickness of the hardmask layer may be significantly reduced compared to a thickness in the conventional art. Moreover, a desired profile of the opening may be implemented using the bowing control pattern. Finally, the opening may have a uniform size and shape over the entire surface.

Referring to FIGS. 2A and 2B, a second mask pattern 19 may be formed in the second mask layer 19L using a lithography process. The second mask pattern 19 may be a photoresist pattern. A first mask pattern 18 may be formed using a first etching process. The first mask pattern 18 may include a preliminary opening 18H exposing the hardmask layer 17L. The hardmask layer 17L may be exposed on a bottom of the preliminary opening 18H. The preliminary opening 18H may have various shapes, such as a circle, a rectangle, a polygon and/or a bar, in a plan view. A plurality of preliminary openings 18H may be repeatedly arranged two-dimensionally on the hardmask layer 17L.

Referring to FIG. 2B, a semiconductor manufacturing apparatus applicable to embodiments of the inventive concepts may include an input/output device 09A, a transporting device 09B, a first etching chamber 01, a second etching chamber 02, and a third etching chamber 03. Each of the first etching chamber 01, the second etching chamber 02, and the third etching chamber 03 may serve to perform an anisotropic etching process using plasma.

For example, the first etching process may be performed using the first etching chamber 01. The substrate 11 having the second mask pattern 19 may be loaded in the first etching chamber 01 using the input/output device 09A and the transporting device 09B. The first mask pattern 18 may be formed by patterning the first mask layer 18L using the second mask pattern 19 as an etch mask. An anisotropic etching process may be used in the patterning of the first mask layer 18L.

Figure 3:
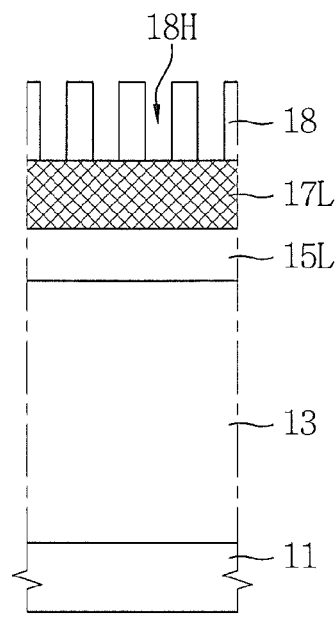

Referring to FIG. 3, the second mask pattern 19 may be removed. An ashing process may be used in the removal of the second mask pattern 19. The first mask pattern 18 may be exposed on the hardmask layer 17L.

Figure 4:
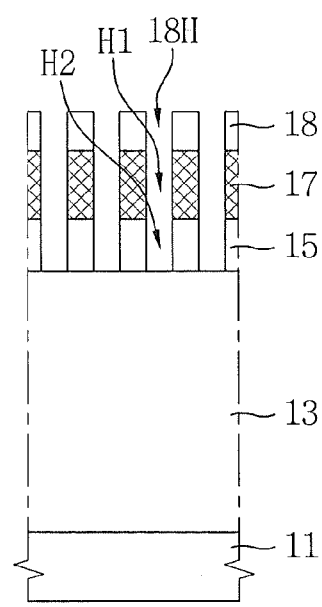

Referring to FIGS. 4 and 2B, a hardmask pattern 17 and a bowing control pattern 15 may be formed using a second etching process. The hardmask pattern 17 may include a first opening H1 aligned under the preliminary opening 18H. The bowing control pattern 15 may include a second opening H2 aligned under the first opening H1. The second opening H2 may be connected to a bottom of the first opening H1. The formation of the hardmask pattern 17 and the bowing control pattern 15 may include an anisotropic etching process. The interlayer insulating layer 13 may be exposed on a bottom of the second opening H2.

For example, the second etching process may be performed in a different chamber from the first etching process. The second etching process may be performed using the second etching chamber 02. The substrate 11 having the first mask pattern 18 may be loaded in the second etching chamber 02 using the input/output device 09A and the transporting device 09B. The hardmask pattern 17 and the bowing control pattern 15 may be formed by sequentially patterning the hardmask layer 17L and the bowing control layer 15L using the first mask pattern 18 as an etch mask. The patterning of the hardmask layer 17L and the bowing control layer 15L may include an anisotropic etching process.

In other embodiments, the second etching process may be performed in the same chamber as in the first etching process.

Figure 5:
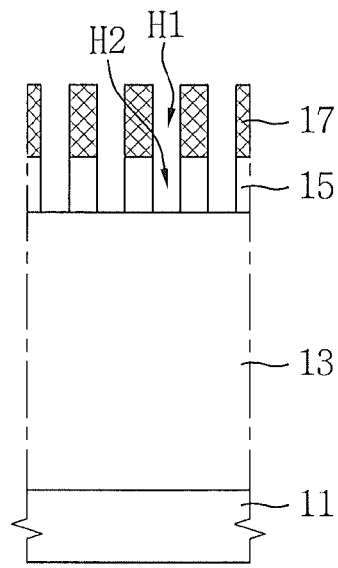

Referring to FIG. 5, the first mask pattern 18 may be removed. An upper surface of the hardmask pattern 17 may be exposed.

Figure 6:
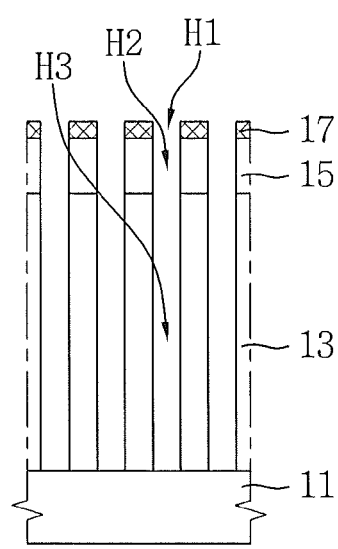

Referring to FIGS. 6 and 2B, a third opening H3 may be formed using a third etching process. The third opening H3 may be connected to the bottom of the second opening H2. The first opening H1, the second opening H2, and the third opening H3 may be vertically aligned. The third opening H3 may have various shapes, such as a circle, a rectangle, a polygon and/or a bar, in a plan view. A plurality of third openings H3 may be formed repeatedly and two-dimensionally on the substrate 11. For example, the third opening H3 may be a contact hole or a trench. The third opening H3 may fully pass through the interlayer insulating layer 13. The third opening H3 may have a high aspect ratio. The third opening H3 may have an aspect ratio of about 20:1 or more.

For example, the third etching process may be performed in a different chamber from the second etching process. The third etching process may be performed using the third etching chamber 03. The substrate 11 having the hardmask pattern 17 and bowing control pattern 15 may be loaded in the third etching chamber 03 using the input/output device 09A and the transporting device 09B. The third opening H3 may be formed by patterning the interlayer insulating layer 13 using the hardmask pattern 17 as an etch mask. The formation of the third opening H3 may include an anisotropic etching process.

In other embodiments, the third etching process may be performed using an in-situ process in the same chamber as the second etching process.

Figure 7:
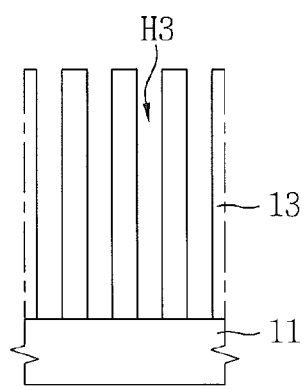

Referring to FIG. 7, the hardmask pattern 17 and the bowing control pattern 15 may be removed. An upper surface of the interlayer insulating layer 13 may be exposed. The substrate 11 may be exposed on a bottom of the third opening H3.

Figure 8:
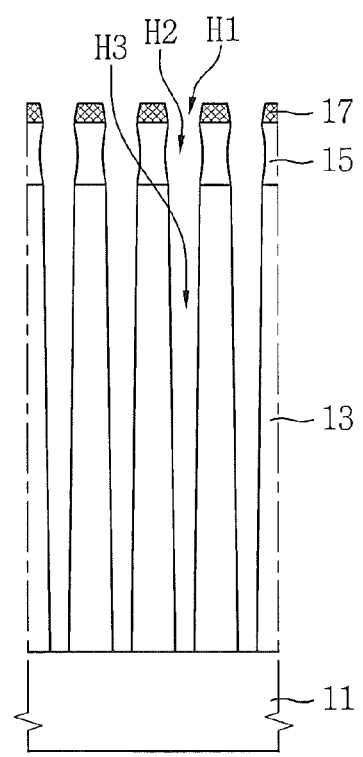

Referring to FIG. 8, while forming the third opening H3 by patterning the interlayer insulating layer 13, side surfaces of the bowing control pattern 15 may be partially removed.

Bowing may occur on sidewalls of the second opening H2. The third opening H3 may have an inverted trapezoidal shape which has a top width greater than a bottom width.

Figure 9:
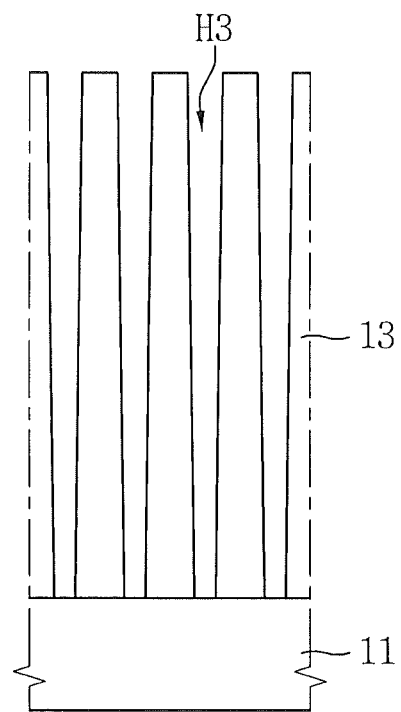

Referring to FIG. 9, the hardmask pattern 17 and the bowing control pattern 15 may be removed. The third opening H3 may have an aspect ratio of about 20:1 or more.

Figure 10A:
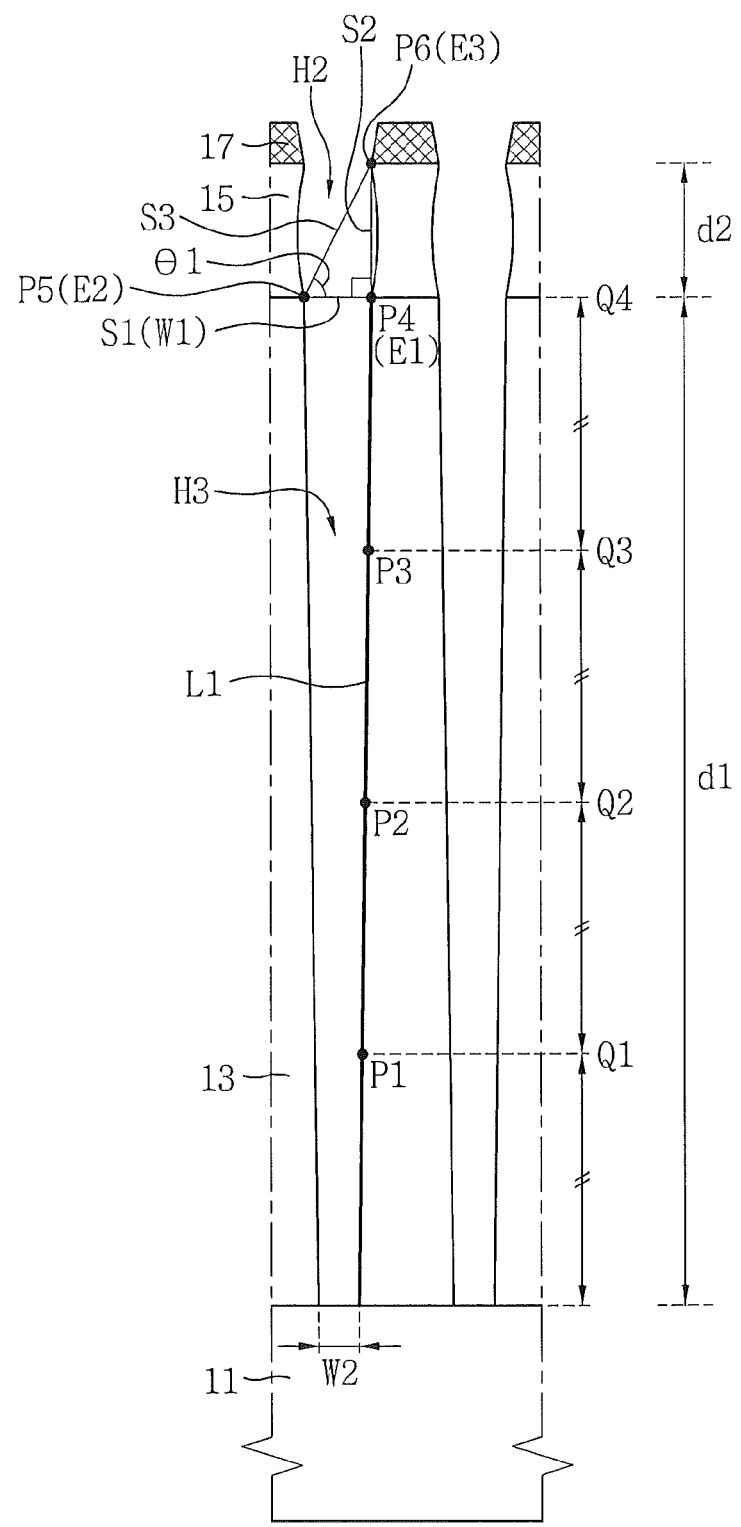
Figure 10B:
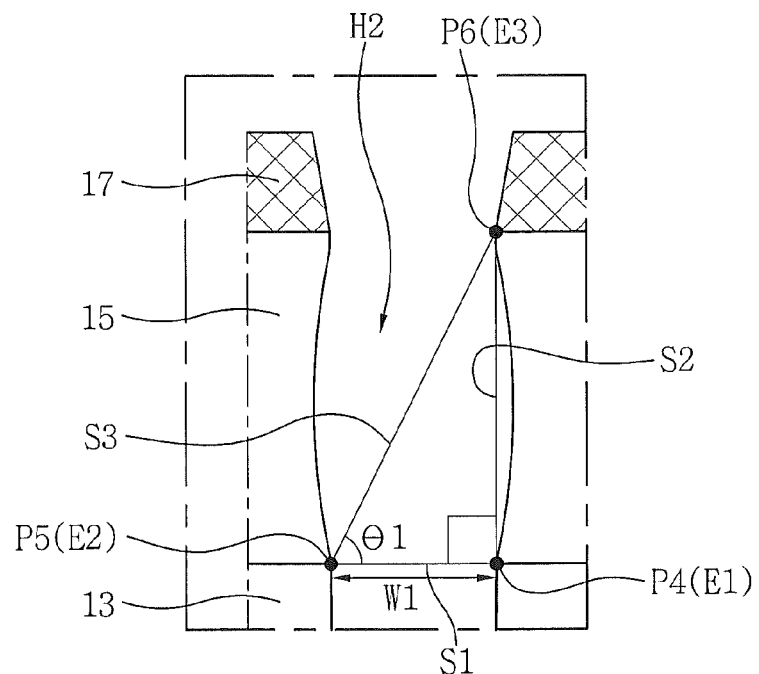

Referring to FIGS. 10A and 10B, the interlayer insulating layer 13 may cover the substrate 11, with the first thickness d1. The third opening H3 may fully pass through the interlayer insulating layer 13. The substrate 11 may be exposed on the bottom of the third opening H3. The depth of the third opening H3 may be substantially the same as the first thickness d1. The upper end of the third opening H3 may have a first width W1, and the lower end of the third opening H3 may have a second width W2. The first width W1 may be defined as a width of the third opening H3. The second width W2 may be smaller than the first width W1. The third opening H3 may be interpreted as having an inverted trapezoidal shape. A lower end of the second opening H2 may be continuous with the upper end of the third opening H3. The lower end of the second opening H2 may be interpreted as having substantially the same horizontal width as the upper end of the third opening H3. The lower end of the second opening H2 may have the first width W1.

First to fourth quartiles P1, P2, P3, and P4 may be defined on a sidewall of the third opening H3. The interlayer insulating layer 13 may include first to fourth vertical quartiles Q1, Q2, Q3, and Q4. The first quartile P1 may be located on a horizontal line passing the first vertical quartile Q1, the second quartile P2 may be located on a horizontal line passing the second vertical quartile Q2, the third quartile P3 may be located on a horizontal line passing the third vertical quartile Q3, and the fourth quartile P4 may be located on a horizontal line passing the fourth vertical quartile Q4. The fourth vertical quartile Q4 may be located on the upper surface of the interlayer insulating layer 13, and the fourth quartile P4 may be located on an upper edge E1 of the interlayer insulating layer 13. The fourth quartile P4 may be in contact with a lower edge of the bowing control pattern 15.

A straight line L1 passing the first quartile P1 and the third quartile P3 may be defined. The straight line L1 may not be perpendicular to an upper surface of the substrate 11. The straight line L1 may be slanted with respect to the upper surface of the substrate 11. The fourth quartile P4 may be located on the straight line L1. The second quartile P2 may be located on the straight line L1.

In some embodiments, the fourth quartile P4 may be spaced apart from the straight line L1. The second quartile P2 may be spaced apart from the straight line L1. The straight line L1 may be perpendicular to the upper surface of the substrate 11.

The bowing control pattern 15 may cover the interlayer insulating layer 13, with the second thickness d2. The second opening H2 may pass through the bowing control pattern 15 to be connected to the third opening H3. The depth of the second opening H2 may be interpreted as being substantially the same as the second thickness d2. Bowing may occur on a sidewall of the second opening H2.

The interlayer insulating layer 13 may include first and second edges E1 and E2 formed on the upper end of the third opening H3. The first and second edges E1 and E2 may be interpreted as being in contact with edges formed on a lower end of the bowing control pattern 15. The fourth quartile P4 may be located on the first edge E1. The second edge E2 may face the first edge E1. The second edge E2 may be located on a horizontal line passing through the first edge E1. A fifth point P5 may be defined on the second edge E1. A first side S1 of a triangle may be defined between the fourth quartile P4 and the fifth point P5. The length of the first side S1 may be the same as the first width W1. The fourth quartile P4 and the fifth point P5 may be interpreted as being in contact with edges formed on the lower end of the bowing control pattern 15.

An upper end of the bowing control pattern 15 may include a third edge E3. A sixth point P6 perpendicular to the first side S1 may be defined on a horizontal line passing through the third edge E3. The sixth point P6 may be located on the third edge E3. A second side S2 of the triangle may be defined between the fourth quartile P4 and the sixth point P6. The length of the second side S2 may be the same as the second thickness d2. The second thickness d2 of the bowing control pattern 15 may be about 100 nm to about 200 nm. A third side S3 (hypotenuse) of the triangle may be defined between the fifth point P5 and the sixth point P6. The first side S1, the second side S2, and the third side S3 may be interpreted as a right triangle. The second side S2 may form a right angle with the first side S1. A first acute angle $\theta 1$ may be formed between the first side S1 and the third side S3. The first acute angle $\theta 1$ may be determined by the second thickness d2 of the bowing control pattern 15, and the first width W1 of the third opening H3. The first acute angle $\theta 1$ may be about 50° to about 80°. A size and shape of the third opening H3 may be adjusted by controlling the first acute angle $\theta 1$.

Figure 10C:
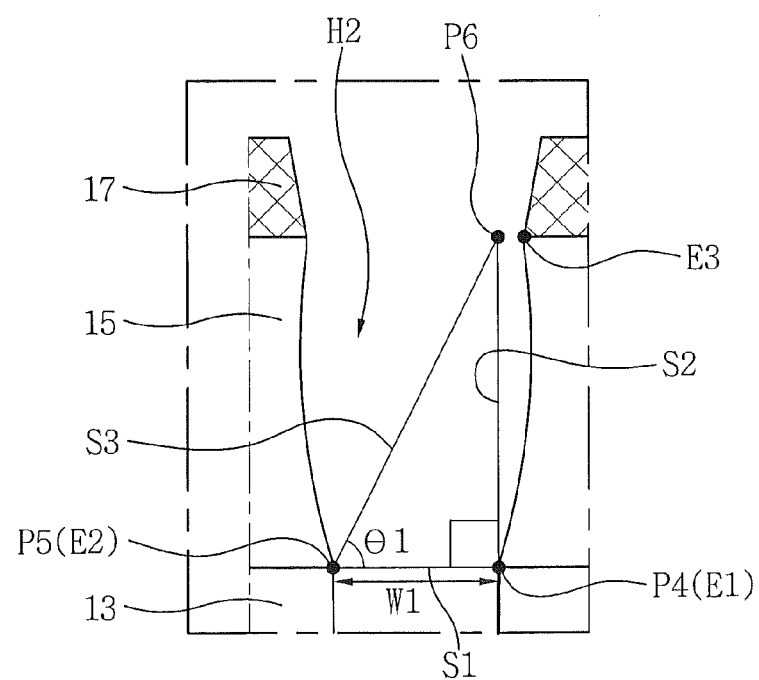

Referring to FIG. 10C, the sixth point P6 may be located apart from the third edge E3.

Figure 11A:
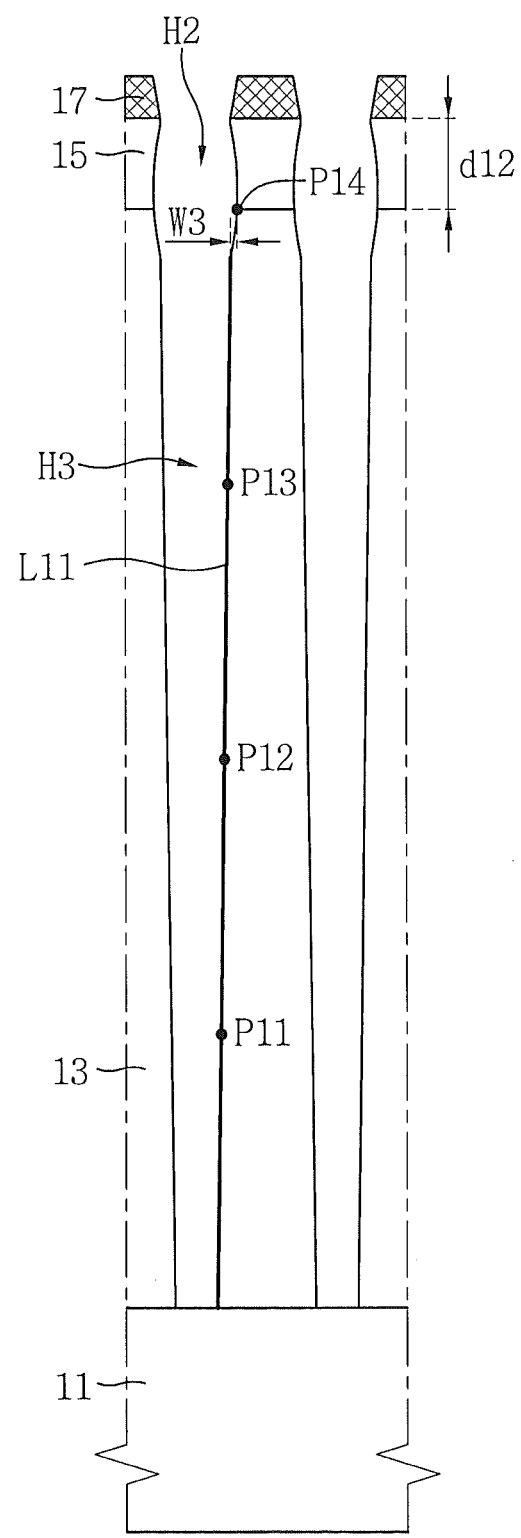
Figure 11B:
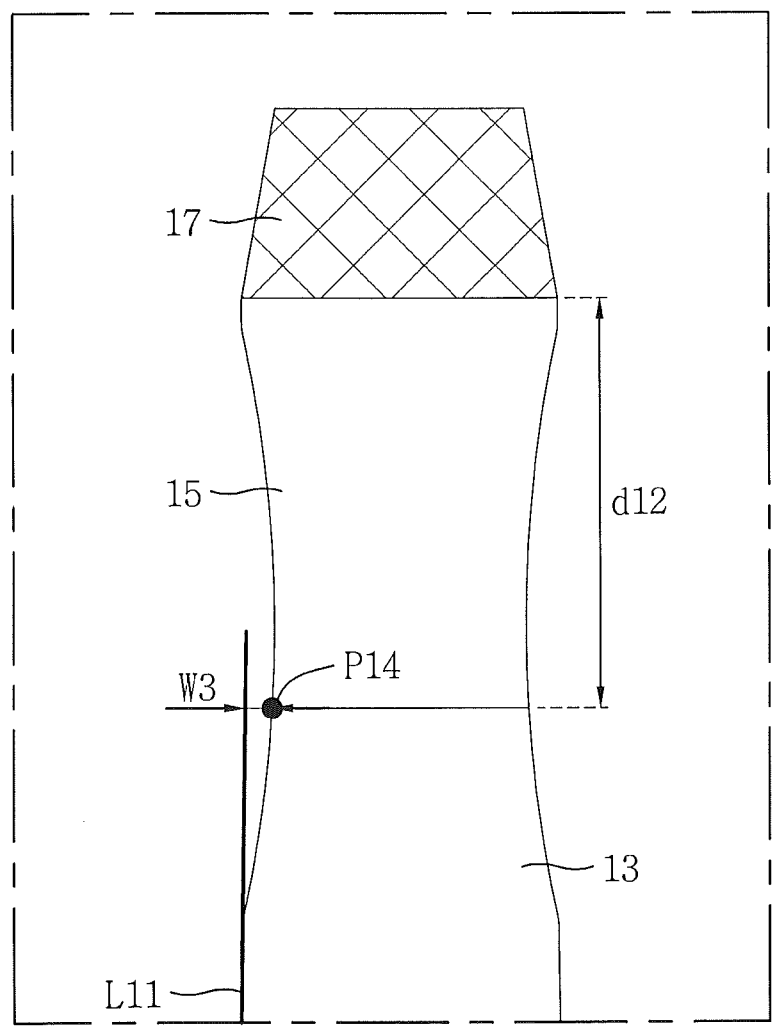

Referring to FIGS. 11A and 11B, shapes of the second opening H2 and the third opening H3 may be adjusted by controlling a second thickness d12 of the bowing control pattern 15. First to fourth quartiles P11, P12, P13, and P14 may be defined on a sidewall of the third opening H3. A straight line L11 passing the first quartile P11 and the third quartile P13 may be defined. The fourth quartile P14 may be spaced apart from the straight line L11. A distance between the fourth quartile P14 and the straight line L11 may be a third width W3. The third width W3 may be about three nanometers or less.

Referring again to FIGS. 10A, 11A, and 11B, the first width W1 may be defined as a width of the third opening H3. The third width W3 may be about 0.05 times the first width W1, or less. The third width W3 may be about 5% of the third opening H3, or less.

It may be advantageous for reducing size and variation of the third opening H3 for the third thickness d3 of the hardmask layer 17L to be relatively smaller than the first thickness d1 of the interlayer insulating layer 13. In an anisotropic dry etching process, a size and location of bowings generated by ion scattering, may be determined depending on the a thickness and shape of the hardmask pattern 17. While performing an anisotropic dry etching process, the thickness and shape of the hardmask pattern 17 may vary due to a phenomenon such as mask-shoulder cracking. Inventors of the inventive concepts have found that when the first acute angle $\theta 1$ is less than about 50°, for example, about 45° or less, a desired size and shape of the third opening H3 may not be obtained due to bowing occurring at an upper portion of the third opening H3.

The inventors of the inventive concepts have found that when performing a process of patterning a structure having a high aspect ratio of about 20:1 or more using a mask pattern in the related art, a desired profile is not obtained due to bowing occurring at an upper portion of a pattern, and it is difficult to apply the patterning process to mass production due to large variation of the pattern. According to embodiments of the inventive concepts, a profile of the third opening H3 having a high aspect ratio of 20:1 or more may be very efficiently controlled through a combination of the bowing control pattern 15 and the hardmask pattern 17. The thickness of the hardmask pattern 17 may be significantly reduced compared to a thickness conventionally used. A desired profile of the third opening H3 may be implemented using the bowing control pattern 15. A plurality of third opening H3 may be repeatedly formed on the substrate 11. The third openings H3 may have a uniform size and shape throughout the entire substrate 11.

FIGS. 12 to 29C are cross-sectional views for describing a method of fabricating a semiconductor device, and semiconductor devices so fabricated, in accordance with embodiments of the inventive concepts.

Figure 12:
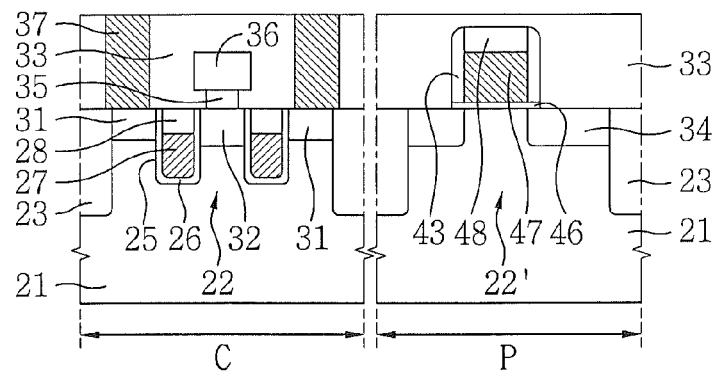

Referring to FIG. 12, a device isolation layer 23 defining a cell active region 22 and a peripheral active region 22' may be formed on a substrate 21 having a cell region C and a peripheral region P. A gate trench 25 may be formed in the cell active region 22. A gate dielectric layer 26, a gate electrode 27, and a gate capping pattern 28 may be formed in the gate trench 25. First and second source/drain areas 31 and 32 may be formed in the cell active region 22 adjacent to the gate electrode 27. A peripheral gate dielectric layer 46, a peripheral gate electrode 47, and a peripheral gate capping pattern 48 may be formed on the peripheral active region 22'. Spacers 43 may be formed on side surfaces of the peripheral gate electrode 47 and the peripheral gate capping pattern 48. Peripheral source/drain areas 34 may be formed in the peripheral active region 22' adjacent to both sides of the peripheral gate electrode 47. An interlayer insulating layer 33 covering the entire substrate 21 may be formed. A bit plug 35 and a bit line 36 may be formed in the interlayer insulating layer 33. A buried contact plug 37 passing through the interlayer insulating layer 33 to be connected to the first source/drain area 31 may be formed.

The first and second source/drain areas 31 and 32, the cell active region 22, the gate dielectric layer 26, and the gate electrode 27 may configure a cell transistor. A plurality of cell transistors may be repeatedly formed in row and column directions on the substrate 21. The cell transistor may function as a switching device. In other embodiments, the switching device may be a planar transistor, a sphere-shaped recess-channel-array transistor (SRCAT), a three-dimensional (3D) transistor, a vertical transistor and/or a nano-wire transistor.

The substrate 21 may be a semiconductor substrate, such as a silicon wafer. The device isolation layer 23 may be formed using a shallow trench isolation (STI) technique. The device isolation layer 23 may include silicon oxide, silicon nitride and/or silicon oxynitride. The first and second source/drain areas 31 and 32 may include different conductivity type impurities from the cell active region 22. For example, the cell active region 22 may include p-type impurities, and the first and second source/drain areas 31 and 32 may include n-type impurities.

The gate dielectric layer 26 may include silicon oxide, silicon nitride, silicon oxynitride and/or a high-K dielectric layer. The gate electrode 27 may include a conductive layer, such as a metal, a metal silicide, a semiconductor and/or polysilicon. An upper end of the gate electrode 27 may be formed at a lower level than upper ends of the first and second source/drain areas 31 and 32. The gate dielectric layer 26 may be interposed between the gate electrode 27 and the cell active region 22. The gate dielectric layer 26 may cover a side surface and bottom of the gate electrode 27. The gate capping pattern 28 may include silicon oxide, silicon nitride, silicon oxynitride and/or a low-K dielectric layer. The gate capping pattern 28 may cover an upper end of the gate electrode 27.

The peripheral source/drain areas 34 may include different conductivity type impurities from the peripheral active region 22'. For example, when the peripheral active region 22' includes p-type impurities, the peripheral source/drain areas 34 may include n-type impurities. When the peripheral active region 22' includes n-type impurities, the peripheral source/drain areas 34 may include p-type impurities. The peripheral gate dielectric layer 46 may include silicon oxide, silicon nitride, silicon oxynitride and/or a high-K dielectric layer. The peripheral gate electrode 47 may include a conductive layer, such as a metal, a metal silicide, a semiconductor and/or polysilicon. The peripheral gate dielectric layer 46 may be interposed between the peripheral gate electrode 47 and the peripheral active region 22'. The peripheral gate capping pattern 48 may include silicon oxide, silicon nitride, silicon oxynitride and/or a low-K dielectric layer. The peripheral gate capping pattern 48 may cover an upper end of the peripheral gate electrode 47. The spacer 43 may include silicon oxide, silicon nitride, silicon oxynitride and/or a low-K dielectric layer. The spacer 43 may cover side surfaces of the peripheral gate capping pattern 48 and peripheral gate electrode 47.

The interlayer insulating layer 33 may include silicon oxide, silicon nitride, silicon oxynitride and/or a low-K dielectric layer. The interlayer insulating layer 33 may cover the device isolation layer 23, the first and second source/drain areas 31 and 32, the gate capping pattern 28, the peripheral source/drain areas 34, the peripheral gate capping pattern 48, and the spacer 43.

The bit plug 35 may include a conductive layer, such as a metal, a metal silicide and/or a semiconductor. The bit plug 35 may be connected to the second source/drain area 32. The bit line 36 may include a conductive layer, such as a metal, a metal silicide and/or a semiconductor. The bit line 36 may be connected to the bit plug 35. The buried contact plug 37 may include a conductive layer, such as a metal, a metal silicide and/or a semiconductor. For example, the buried contact plug 37 may include W, Ru and/or TiN.

Figure 13:
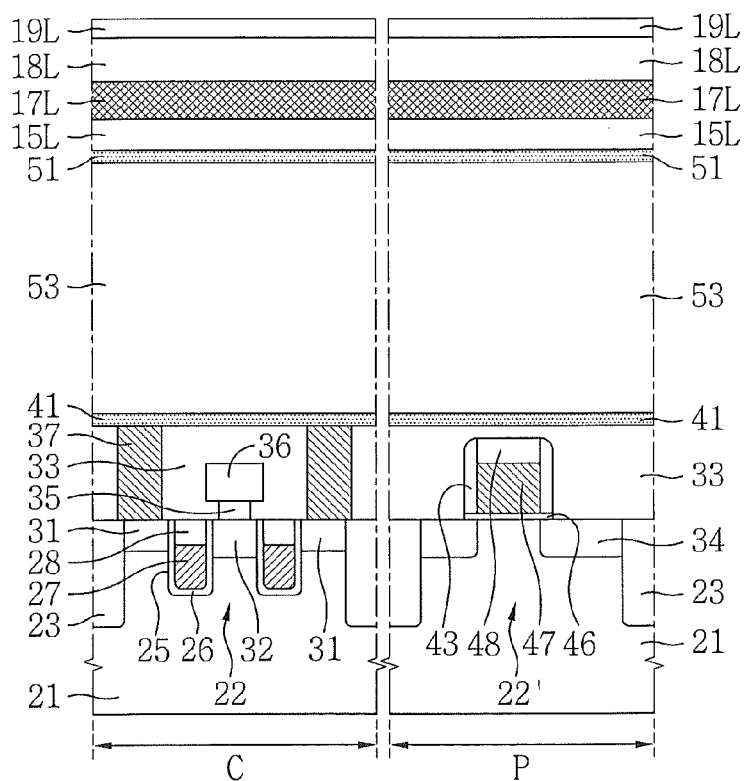

Referring to FIG. 13, an etch-stopping layer 41 may be formed on the interlayer insulating layer 33 and the buried contact plug 37. A molding layer 53 may be formed on the etch-stopping layer 41. A supporter 51 may be formed on the molding layer 53. A bowing control layer 15L may be formed on the supporter 51. A hardmask layer 17L may be formed on the bowing control layer 15L. A first mask layer 18L may be formed on the hardmask layer 17L. A second mask layer 19L may be formed on the first mask layer 18L.

The etch-stopping layer 41 may fully cover the cell region C and the peripheral region P. The etch-stopping layer 41 may include a material having a high etch selectivity with respect to the molding layer 53. The etch-stopping layer 41 may include silicon oxide, silicon nitride and/or silicon oxynitride. For example, the etch-stopping layer 41 may include silicon nitride. The molding layer 53 may be a single layer or a multiple layer. The molding layer 53 may include silicon oxide, silicon nitride and/or silicon oxynitride. The supporter 51 may include a different material from the molding layer 53. The supporter 51 may include a material having a high etch selectivity with respect to the molding layer 53. For example, the supporter 51 may include silicon nitride and/or a metal oxide. The bowing control layer 15L, the hardmask layer 17L, the first mask layer 18L, and the second mask layer 19L may have a configuration similar to that described with reference to FIGS. 1 to 11B.

Figure 14:
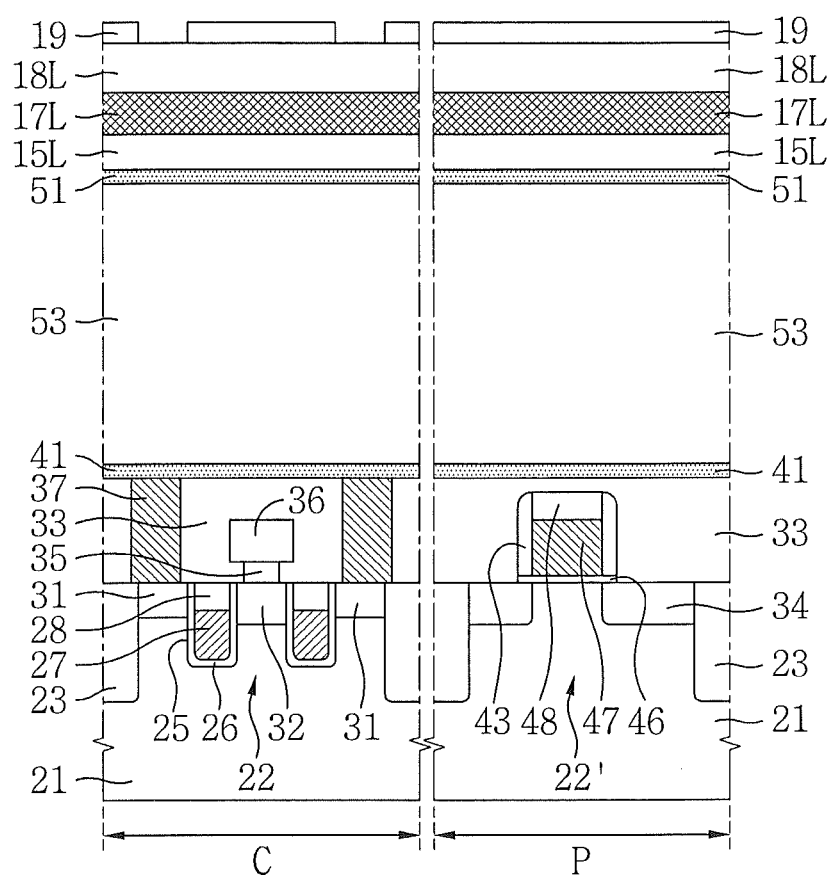

Referring to FIG. 14, a second mask pattern 19 may be formed in the second mask layer 19L, using a lithography process.

Figure 15:
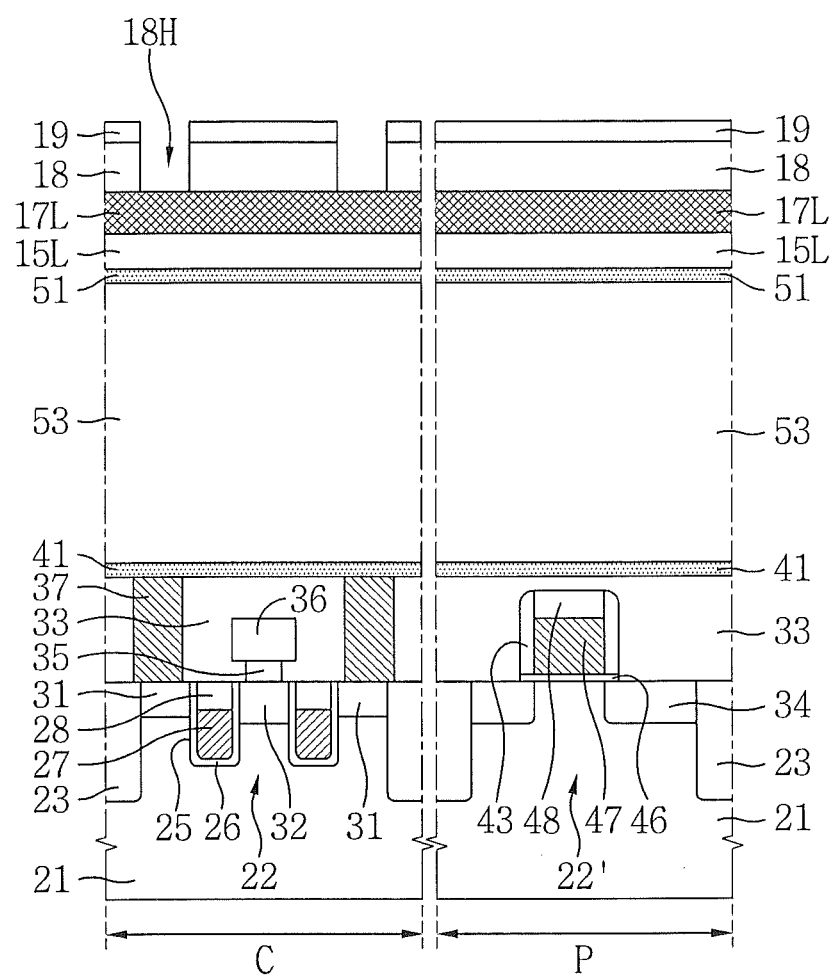

Referring to FIG. 15, a first mask pattern 18 may be formed by patterning the first mask layer 18L, using the second mask pattern 19 as an etch mask. The first mask pattern 18 may include a preliminary opening 18H exposing the hardmask layer 17L.

Figure 16:
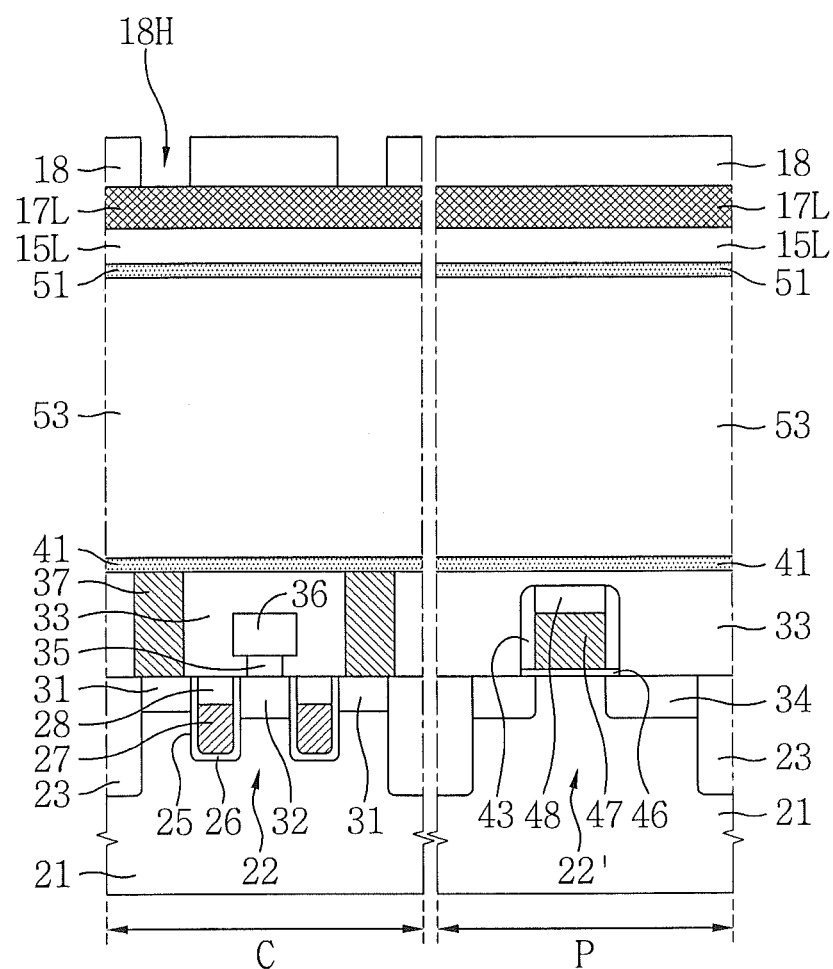

Referring to FIG. 16, the second mask pattern 19 may be removed. An upper surface of the first mask pattern 18 may be exposed.

Figure 17:
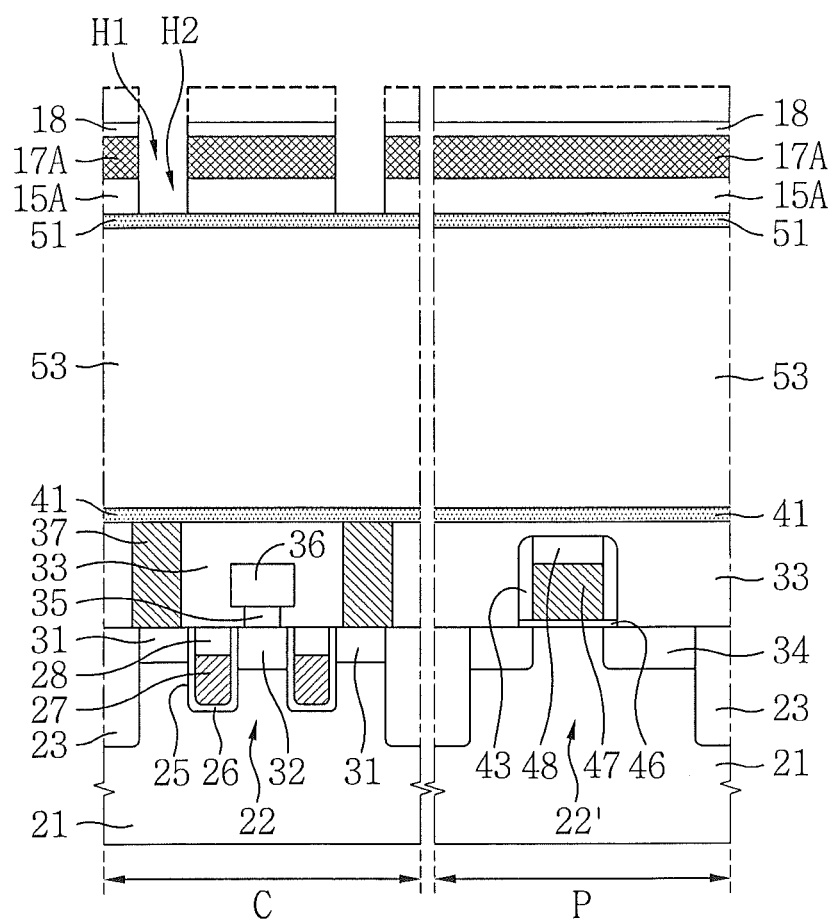

Referring to FIG. 17, a hardmask pattern 17A and a bowing control pattern 15A may be formed by sequentially patterning the hardmask layer 17L and the bowing control layer 15L, using the first mask pattern 18 as an etch mask. The hardmask pattern 17A may include a first opening H1. The bowing control pattern 15A may include a second opening H2 aligned under the first opening H1. The second opening H2 may be connected to a bottom of the first opening H1.

Figure 18:
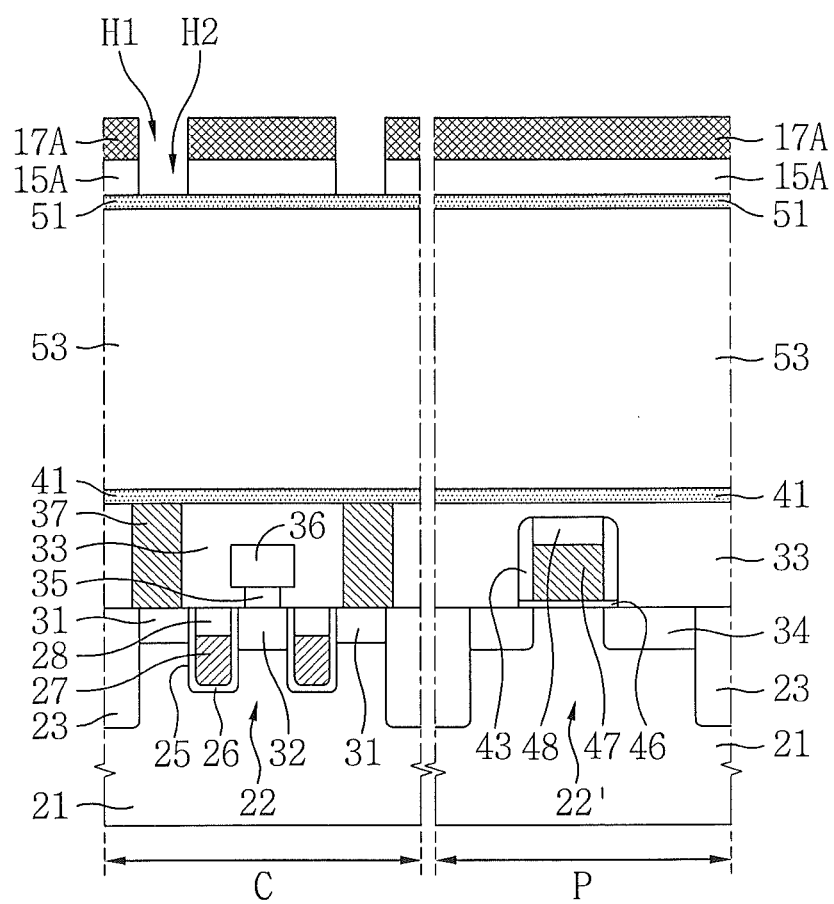

Referring to FIG. 18, the first mask pattern 18 may be removed.

Figure 19:
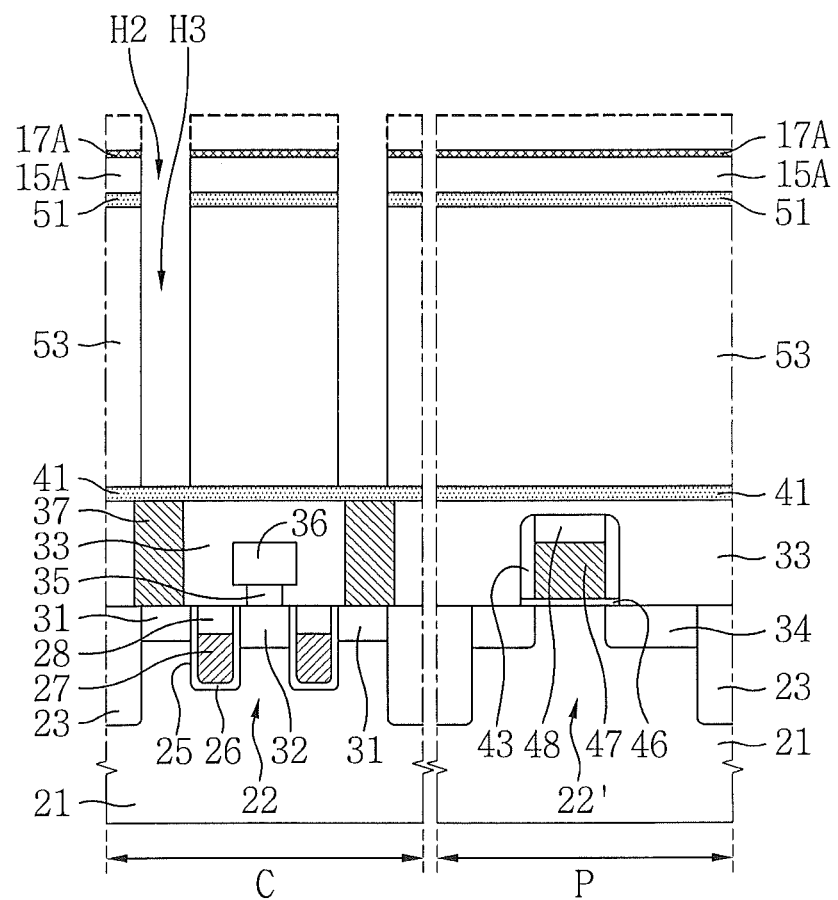

Referring to FIG. 19, a third opening H3 may be formed by patterning the supporter 51 and the molding layer 53, using the hardmask pattern 17A as an etch mask. The third opening H3 may have an aspect ratio of about 20:1 or more.

Figure 20:
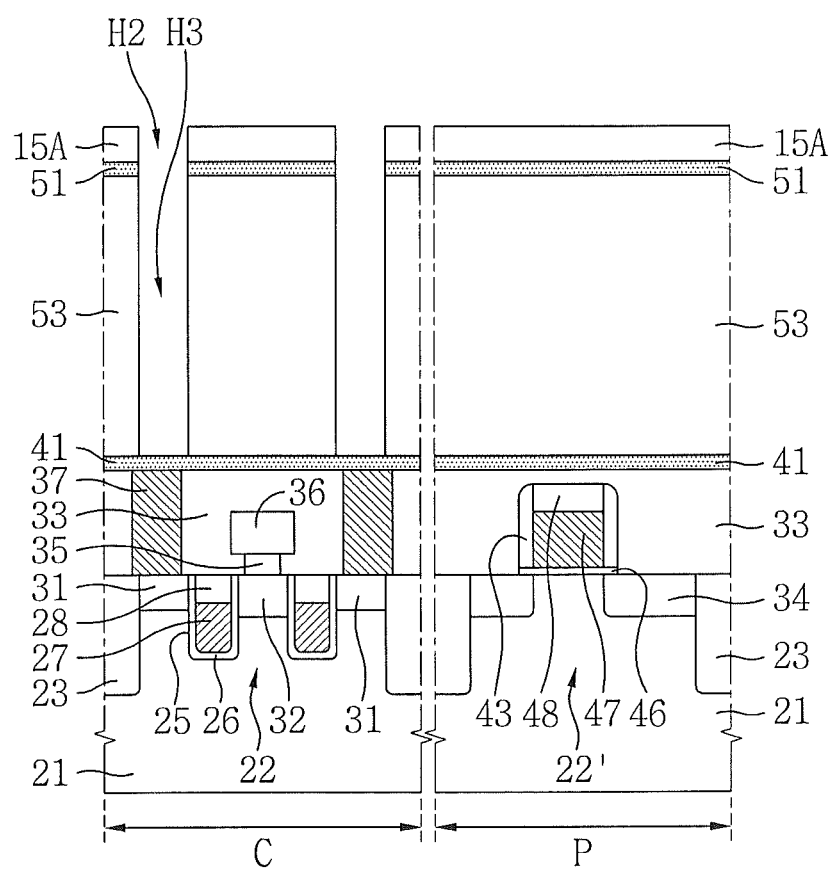

Referring to FIG. 20, the hardmask pattern 17A may be removed.

Figure 21:
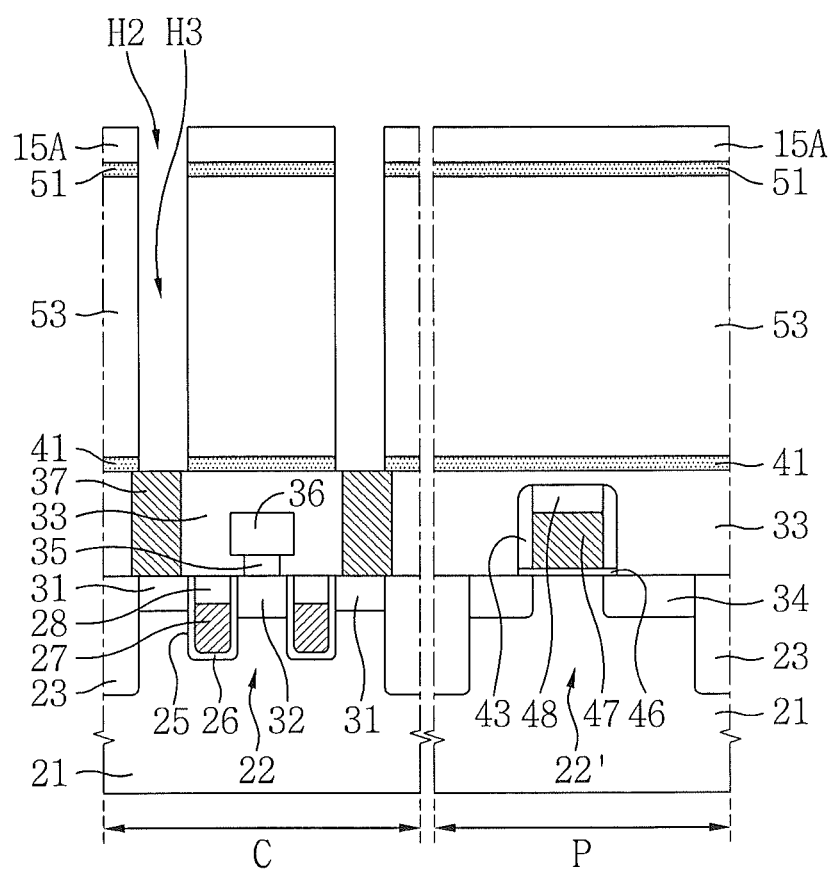

Referring to FIG. 21, the etch-stopping layer 41 may be removed to expose the buried contact plug 37 on a bottom of the third opening H3.

In other embodiments, the removal of the etch-stopping layer 41 may be performed before removing the hardmask pattern 17A.

Figure 22:
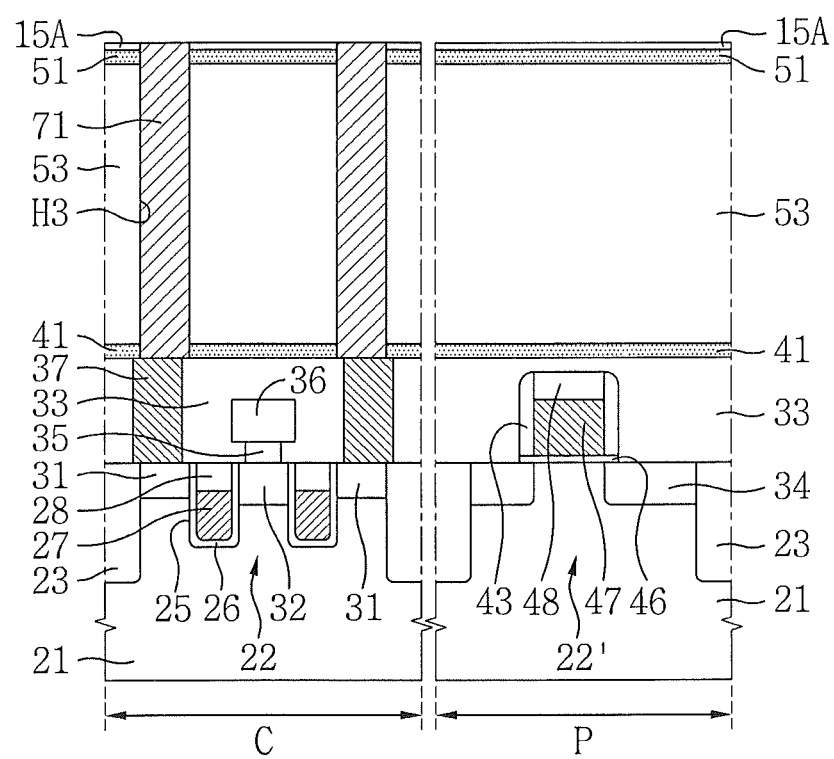

Referring to FIG. 22, a lower electrode 71 may be formed in the third opening H3. The formation of the lower electrode 71 may include a thin film formation process and a planarization process. The lower electrode 71 may be connected to the buried contact plug 37. The lower electrode 71 may include a metal layer, such as a Ru layer, a RuO layer, a Pt layer, a PtO layer, an Ir layer, an IrO layer, a SrRuO (SRO) layer, a (Ba, Sr)RuO (BSRO) layer, CaRuO (CRO) layer, a BaRuO layer, a La(Sr,Co)O layer, a Ti layer, a TiN layer, a W layer, a WN layer, a Ta layer, a TaN layer, a TiAlN layer, a TiSiN layer, a TaAlN layer and/or a TaSiN layer. A side surface of the lower electrode 71 may be in contact with a sidewall of the third opening H3.

In other embodiments, the bowing control pattern 15A may be completely removed before forming the lower electrode 71.

Figure 23A:
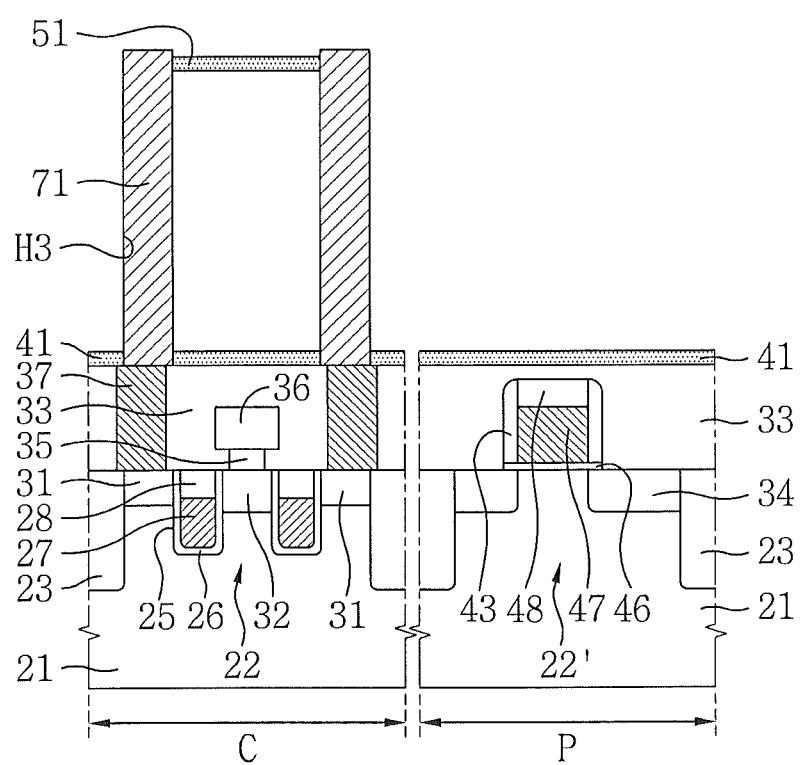

Referring to FIG. 23A, the bowing control pattern 15A and the molding layer 53 may be removed. The lower electrode 71, the supporter 51, and the etch-stopping layer 41 may be retained. The lower electrode 71 may have a pillar shape having a vertical height greater than a horizontal width. The aspect ratio of the lower electrode 71 may be about 20:1 to about 100:1, or more. The supporter 51 may serve to prevent collapsing of the lower electrode 71.

Figure 23B:
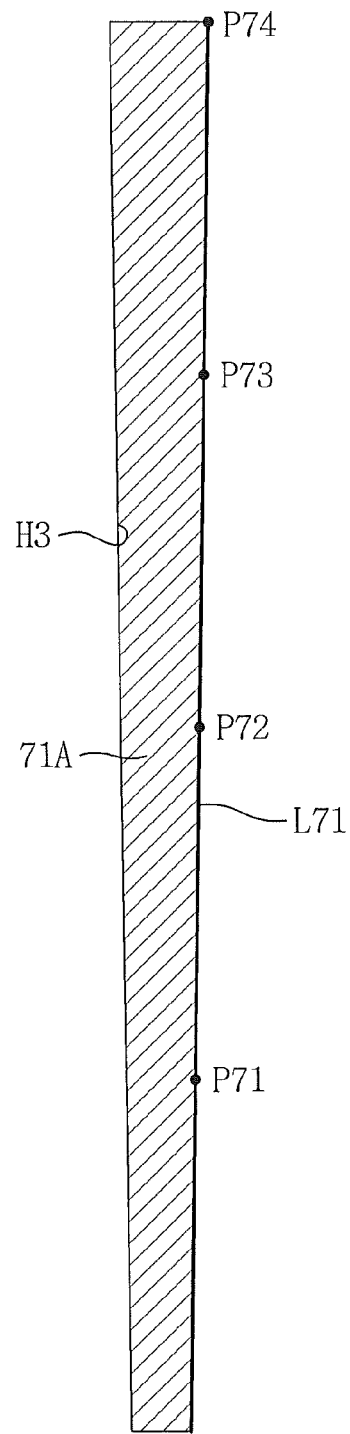

Referring to FIG. 23B, the lower electrode 71A may have an inverted trapezoidal shape having a top width greater than a bottom width. The lower electrode 71A may have an aspect ratio of about 20:1 to about 100:1, or more. First to fourth quartiles P71, P72, P73, and P74 may be defined on a side surface of the lower electrode 71A. The fourth quartile P74 may be located on an upper edge of the lower electrode 71A. A straight line L71 passing the first quartile P71 and the third quartile P73 may be defined. The straight line L71 may not be perpendicular to an upper surface of the substrate 11. The straight line L71 may be slanted with respect to the upper surface of the substrate 11. The fourth quartile P74 may be located on the straight line L71. The second quartile P72 may be located on the straight line L71.

Figure 23C:
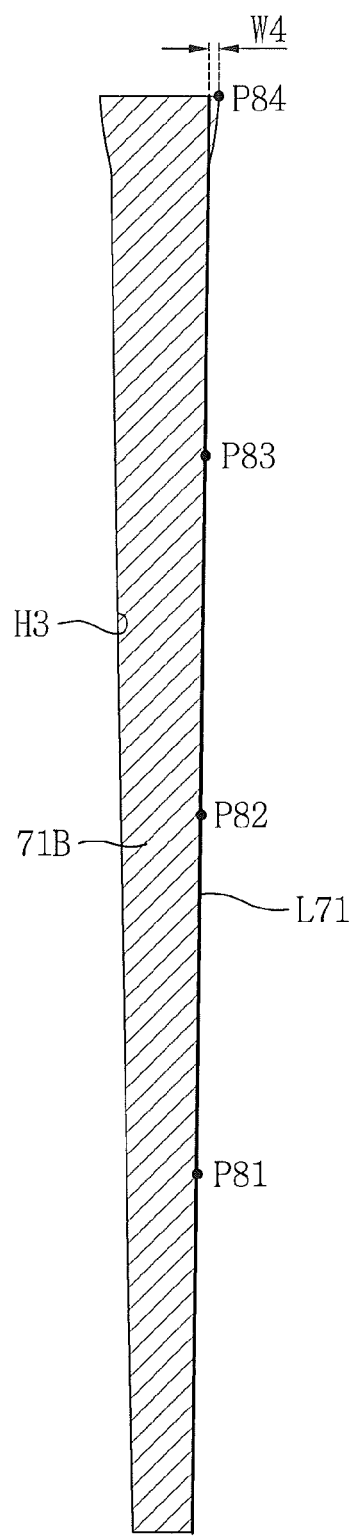

Referring to FIG. 23C, first to fourth quartiles P81, P82, P83, and P84 may be defined on a side surface of a lower electrode 71B. The fourth quartile P84 may be located on an upper edge of the lower electrode 71B. A straight line L71 passing the first quartile P81 and the third quartile P83 may be defined. The straight line L71 may not be perpendicular to an upper surface of the substrate 11. The straight line L71 may be slanted with respect to the upper surface of the substrate 11. The fourth quartile P84 may be spaced apart from the straight line L71. The second quartile P82 may be located on the straight line L71.

A distance between the fourth quartile P84 and the straight line L71 may be a fourth width W4. The fourth width W4 may be about three nanometers or less. The width of the lower electrode 71B may be defined as a width of an upper end of the lower electrode 71B. The fourth width W4 may be about 0.05 times a width of the lower electrode 71B, or less. The fourth width W4 may be about 5% of the lower electrode 71B, or less.

Figure 24:
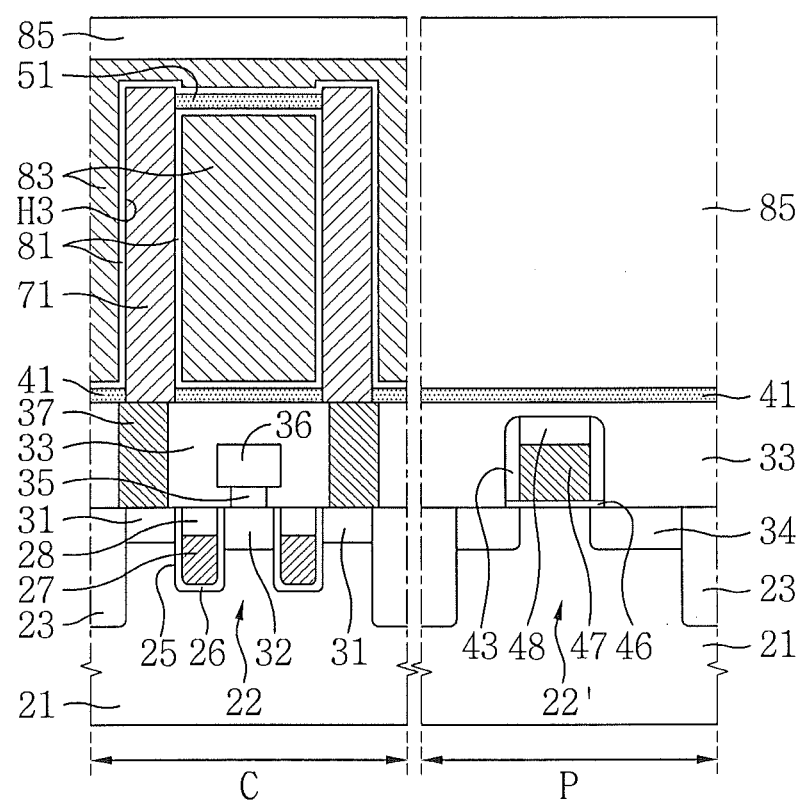

Referring to FIG. 24, a capacitor dielectric layer 81 covering surfaces of the lower electrodes 71 and supporter 51 may be formed on the cell region C. An upper electrode 83 may be formed on the capacitor dielectric layer 81. An upper insulating layer 85 covering the cell region C and the peripheral region P may be formed. The upper insulating layer 85 may be in contact with the upper electrode 83, and the upper insulating layer 85 may be in contact with the etch-stopping layer 41.

The capacitor dielectric layer 81 may include a TaO layer, a TaAlO layer, a TaON layer, an AlO layer, a HfO layer, a ZrO layer, a ZrSiO layer, a TiO layer, a TiAlO layer, a (Ba,Sr)TiO (BST) layer, a SrTiO (STO) layer, a BaTiO (BTO) layer, a Pb(Zr,Ti)O (PZT) layer, a (Pb,La)(Zr,Ti) layer, a Ba(Zr,Ti)O layer and/or a Sr(Zr,Ti)O layer. The upper electrode 83 may include a metal layer, such as a Ru layer, a RuO layer, a Pt layer, a PtO layer, an Ir layer, an IrO layer, a SrRuO (SRO) layer, a (Ba,Sr)RuO (BSRO) layer, a CaRuO (CRO) layer, a BaRuO layer, a La(Sr,Co)O layer, a Ti layer, a TiN layer, a W layer, a WN layer, a Ta layer, a TaN layer, a TiAlN layer, a TiSiN layer, a TaAlN layer and/or a TaSiN layer. The upper insulating layer 85 may include silicon oxide, silicon nitride and/or silicon oxynitride.

Figure 25:
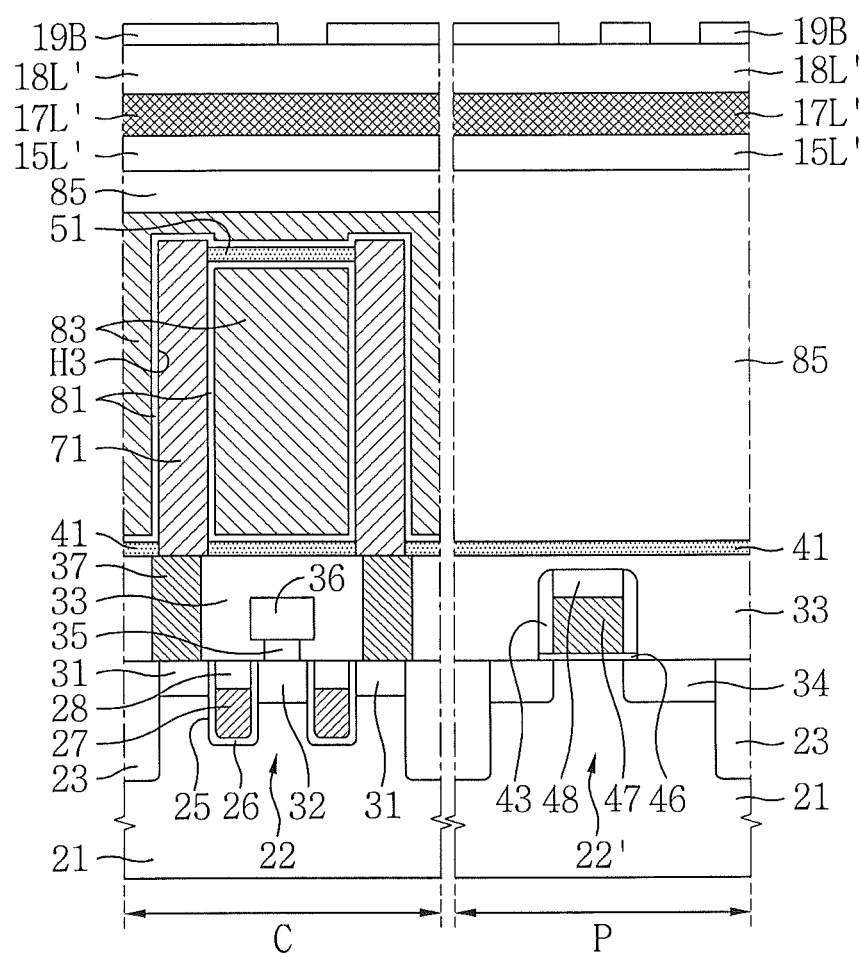

Referring to FIG. 25, an upper bowing control layer 15L' may be formed on the upper insulating layer 85. An upper hardmask layer 17L' may be formed on the upper bowing control layer 15L'. A first upper mask layer 18L' may be formed on the upper hardmask layer 17L'. A second upper mask pattern 19B may be formed on the first upper mask layer 18L'. The upper bowing control layer 15L', the upper hardmask layer 17L', the first upper mask layer 18L', and the second upper mask pattern 19B may have a configuration similar to that described with reference to FIGS. 1 to 11B.

Figure 26:
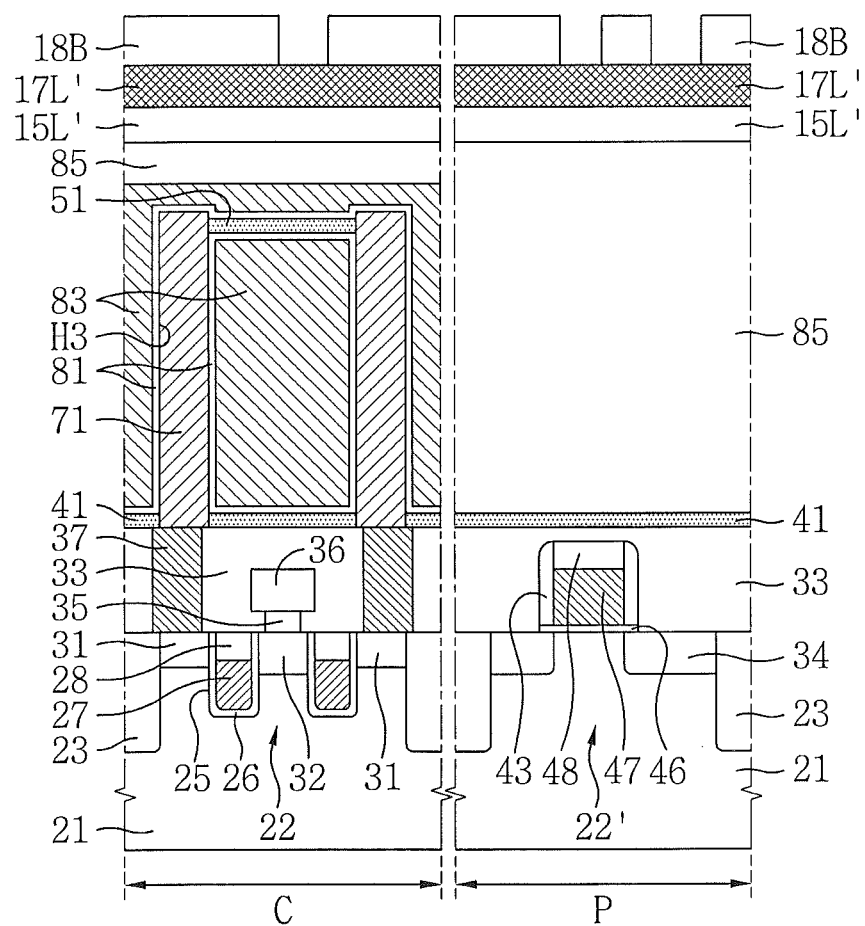

Referring to FIG. 26, a first upper mask pattern 18B may be formed by patterning the first upper mask layer 18L', using the second upper mask pattern 19B as an etch mask. The second upper mask pattern 19B may be removed.

Figure 27:
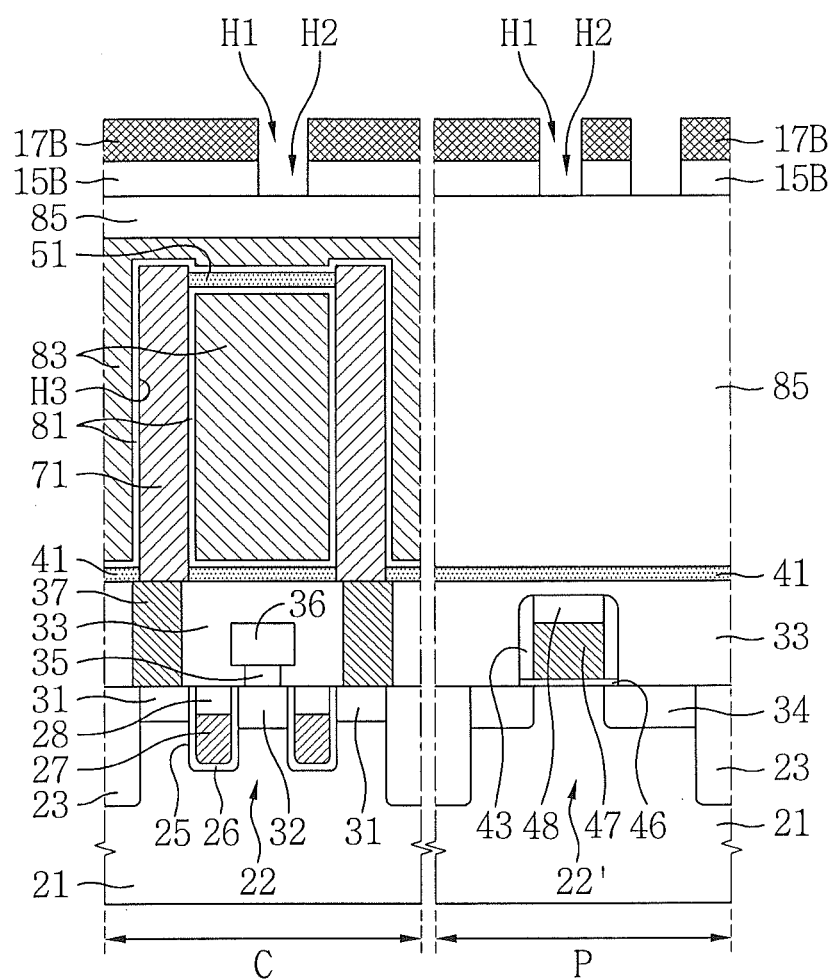

Referring to FIG. 27, an upper hardmask pattern 17B and an upper bowing control pattern 15B may be formed by sequentially patterning the upper hardmask layer 17L' and the upper bowing control layer 15L', using the first upper mask pattern 18B as an etch mask. The upper hardmask pattern 17B may include a first opening H1. The upper bowing control pattern 15B may include a second opening H2 aligned under the first opening H1. The second opening H2 may be connected to a bottom of the first opening H1.

The first upper mask pattern 18B may be removed.

Figure 28:
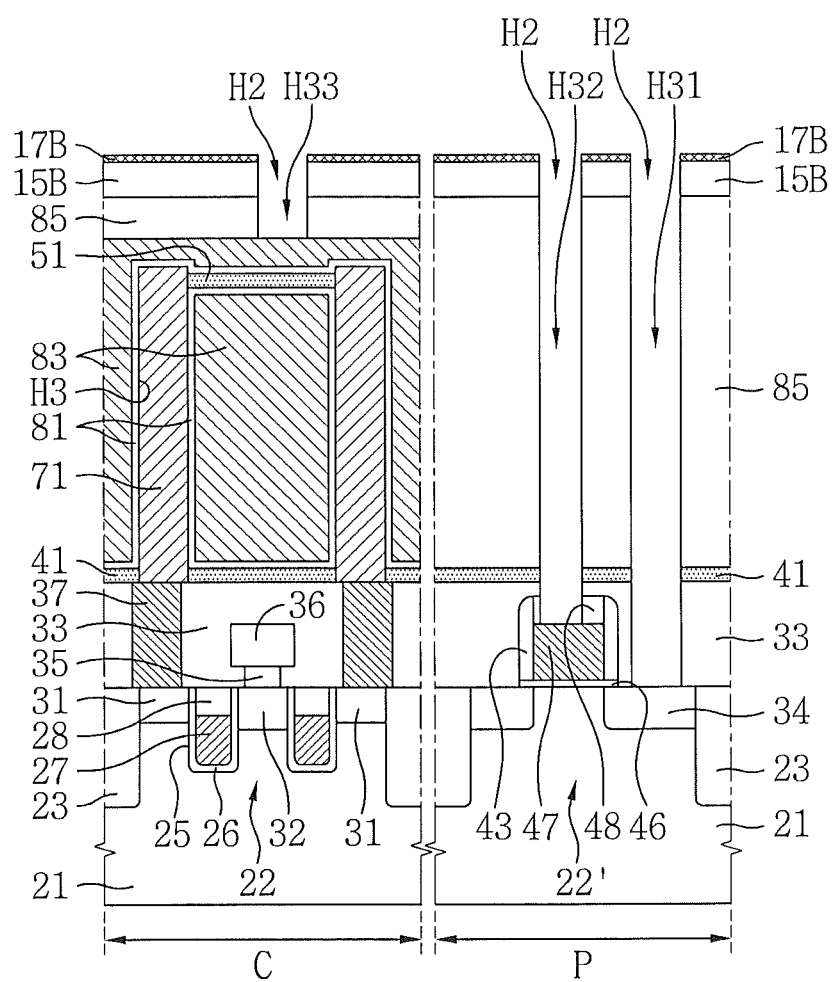

Referring to FIG. 28, fourth to sixth openings H31, H32, and H33 may be formed by patterning the upper insulating layer 85, the etch-stopping layer 41, the interlayer insulating layer 33, and the peripheral gate capping pattern 48, using the upper hardmask pattern 17B as an etch mask. One selected from the peripheral source/drain areas 34 may be exposed on a bottom of the fourth opening H31. The peripheral gate electrode 47 may be exposed on a bottom of the fifth opening H32. The upper electrode 83 may be exposed on a bottom of the sixth opening H33.

Figure 29A:
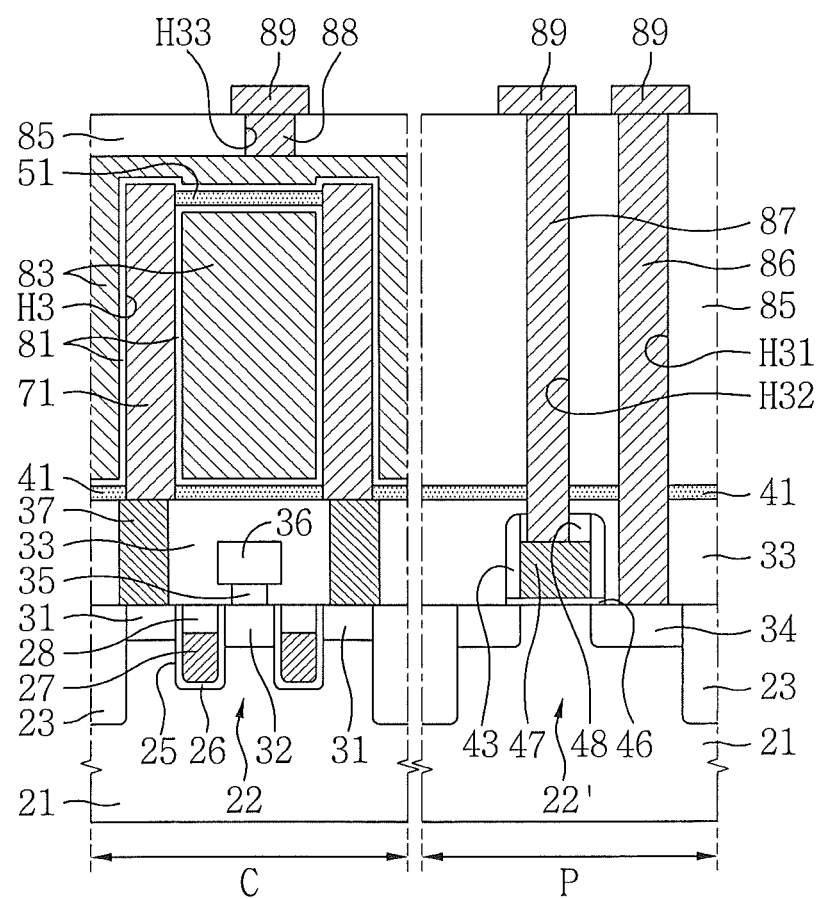

Referring to FIG. 29A, the upper hardmask pattern 17B and the upper bowing control pattern 15B may be removed. First to third plugs 86, 87, and 88 may be formed in the fourth to sixth openings H31, H32, and H33. Upper interconnections 89 connected to the first to third plugs 86, 87, and 88 may be formed on the upper insulating layer 85. The first to third plugs 86, 87, and 88 and the upper interconnections 89 may include a conductive material, such as a metal, a metal silicide and/or a conductive carbon group.

Figure 29B:
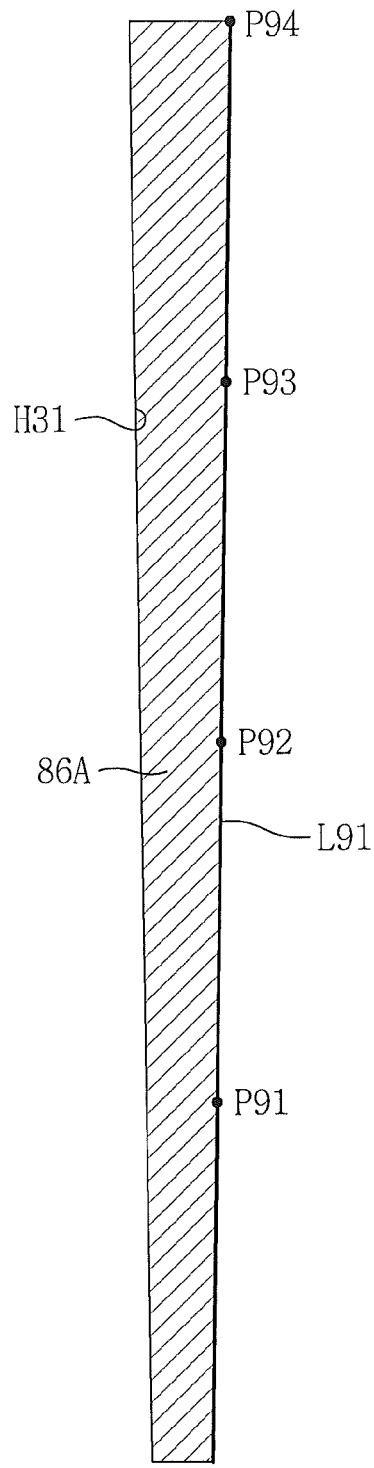

Referring to FIG. 29B, a first plug 86A may have an inverted trapezoidal shape having a top width greater than a bottom width. The first plug 86A may have a high aspect ratio of 20:1 to 100:1, or more. First to fourth quartiles P91, P92, P93, and P94 may be defined on a side surface of the first plug 86A. The fourth quartile P94 may be located on an upper edge of the first plug 86A. A straight line L91 passing the first quartile P91 and the third quartile P93 may be defined. The straight line L91 may not be perpendicular to an upper surface of the substrate 11. The straight line L91 may be slanted with respect to the upper surface of the substrate 11. The fourth quartile P94 may be located on the straight line L91. The second quartile P92 may be located on the straight line L91.

The second and third plugs 87 and 88 may have a similar shape to the first plug 86A.

Figure 29C:
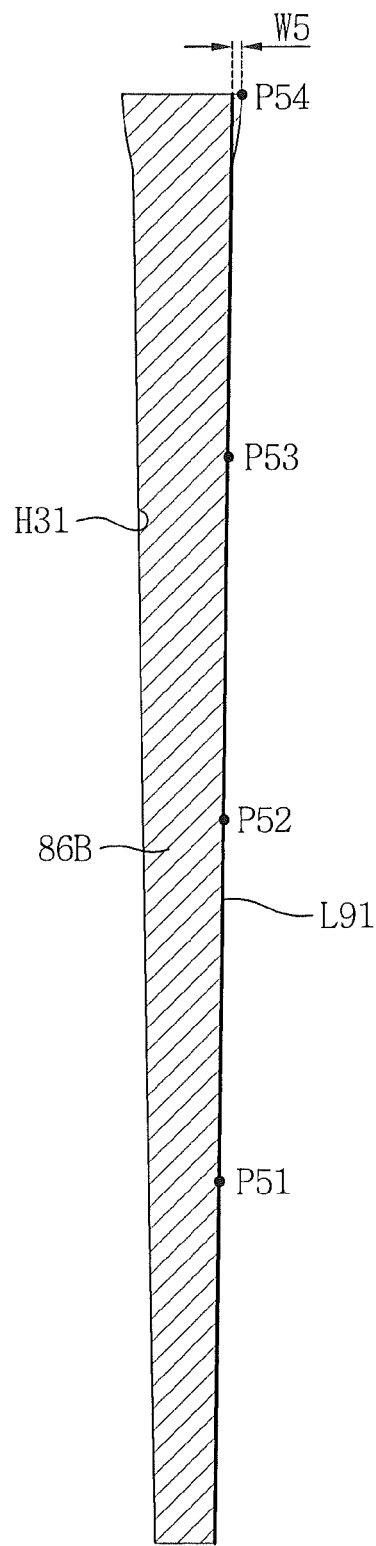

Referring to FIG. 29C, first to fourth quartiles P51, P52, P53, and P54 may be defined on a side surface of a first plug 86B. The fourth quartile P54 may be located on an upper edge of the first plug 86B. A straight line L91 passing the first quartile P51 and the third quartile P53 may be defined. The straight line L91 may not be perpendicular to an upper surface of the substrate 11. The straight line L91 may be slanted with respect to the upper surface of the substrate 11. The fourth quartile P54 may be spaced apart from the straight line L91. The second quartile P52 may be located on the straight line L91.

A distance between the fourth quartile P54 and the straight line L91 may be a fifth width W5. The fifth width W5 may be about three nanometers or less. The width of the first plug 86B may be defined as a width of an upper end of the first plug 86B. The fifth width W5 may be about 0.05 times a width of the first plug 86B, or less. The fifth width W5 may be about 5% of the first plug 86B, or less. The second and third plugs 87 and 88 may have a similar shape to the first plug 86B.

FIGS. 30 to 39 are cross-sectional views for describing a method of fabricating a semiconductor device in accordance with embodiments of the inventive concepts. A semiconductor device illustrated in FIGS. 30 to 39 is a part of a cell region of a NAND flash memory.

Figure 30:
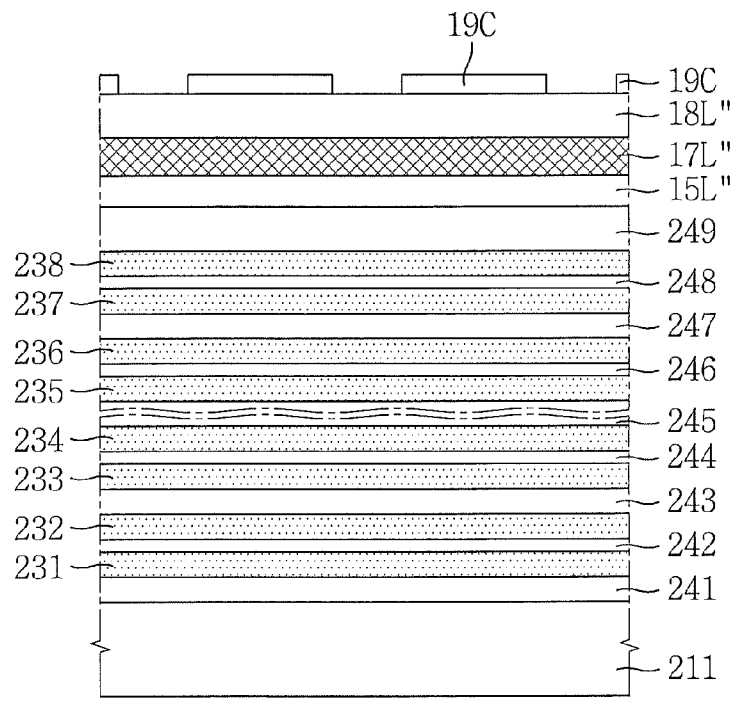

Referring to FIG. 30, first to ninth insulating layers 241, 242, 243, 244, 245, 246, 247, 248, and 249, and first to eighth sacrificial layers 231, 232, 233, 234, 235, 236, 237, and 238 may be formed on a substrate 211. A bowing control layer 15L" may be formed the ninth insulating layer 249. A hardmask layer 17L" may be formed on the bowing control layer 15L". A first mask layer 18L" may be formed on the hardmask layer 17L". A second mask pattern 19C may be formed on the first mask layer 18L". The bowing control layer 15L", the hardmask layer 17L", the first mask layer 18L", and the second mask pattern 19C may have a configuration similar to that described with reference to FIGS. 1 to 11B. The bowing control layer 15L" may include a different material from the ninth insulating layer 249.

The substrate 211 may be a semiconductor substrate, such as a silicon wafer or an SOI wafer. The first to ninth insulating layers 241, 242, 243, 244, 245, 246, 247, 248, and 249, and the first to eighth sacrificial layers 231, 232, 233, 234, 235, 236, 237, and 238 may be stacked alternately and repeatedly. The first to ninth insulating layers 241, 242, 243, 244, 245, 246, 247, 248, and 249 and the first to eighth sacrificial layers 231, 232, 233, 234, 235, 236, 237, and 238 may include different materials from each other. The first to eighth sacrificial layers 231, 232, 233, 234, 235, 236, 237, and 238 may include a material having a high etch selectivity with respect to the first to ninth insulating layers 241, 242, 243, 244, 245, 246, 247, 248, and 249.

Figure 31:
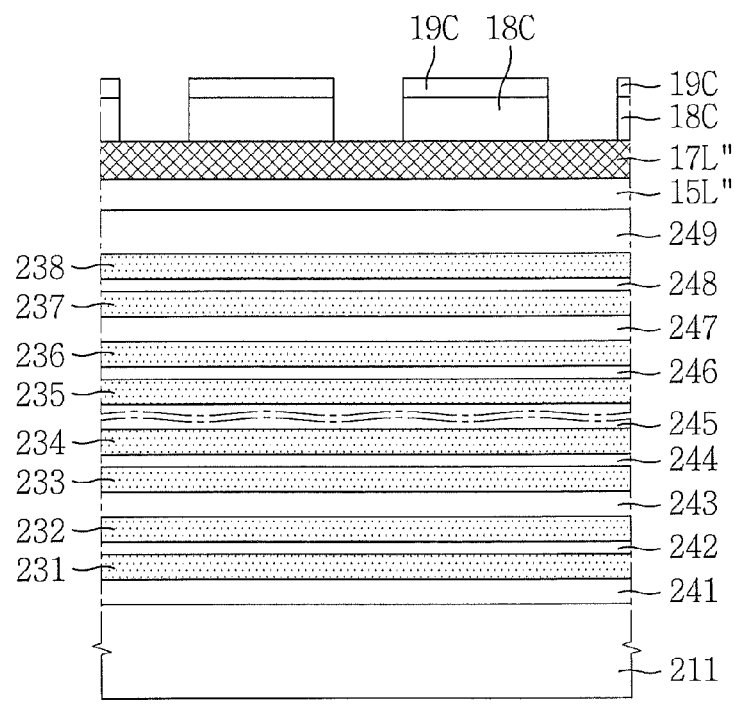

Referring to FIG. 31, a first mask pattern 18C may be formed by patterning the first mask layer 18L", using the second mask pattern 19C as an etch mask.

Figure 32:
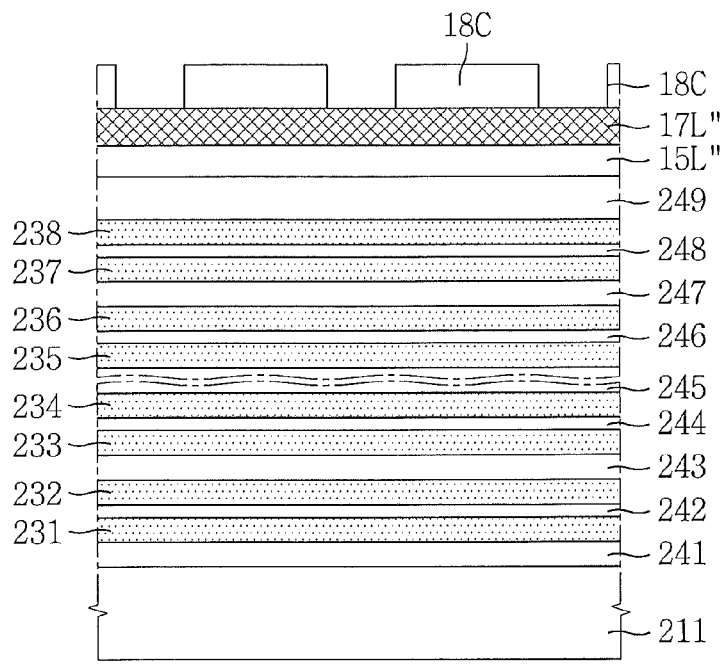

Referring to FIG. 32, the second mask pattern 19C may be removed.

Figure 33:
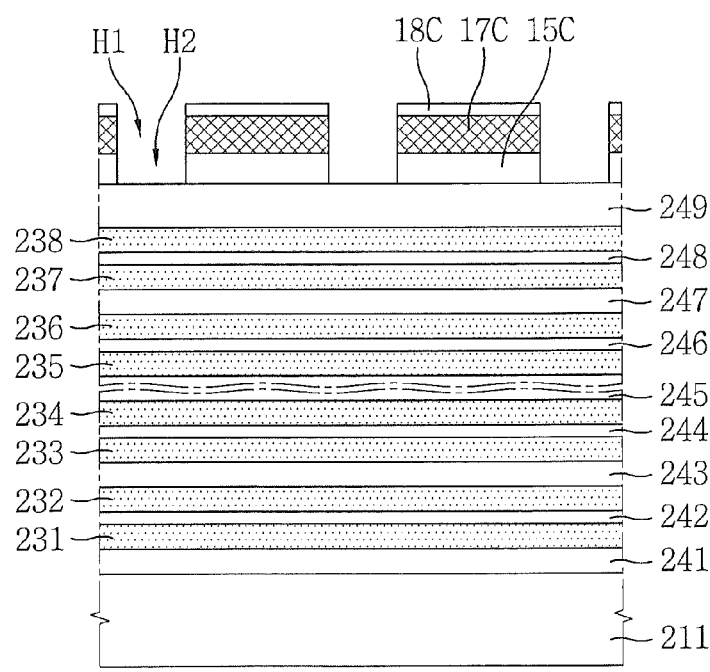

Referring to FIG. 33, a hardmask pattern 17C and a bowing control pattern 15C may be formed by sequentially patterning the hardmask layer 17L" and the bowing control layer 15L", using the first mask pattern 18C as an etch mask. The hardmask pattern 17C may include a first opening H1. The bowing control pattern 15C may include a second opening H2 aligned under the first opening H1. The second opening H2 may be connected to the first opening H1.

Figure 34:
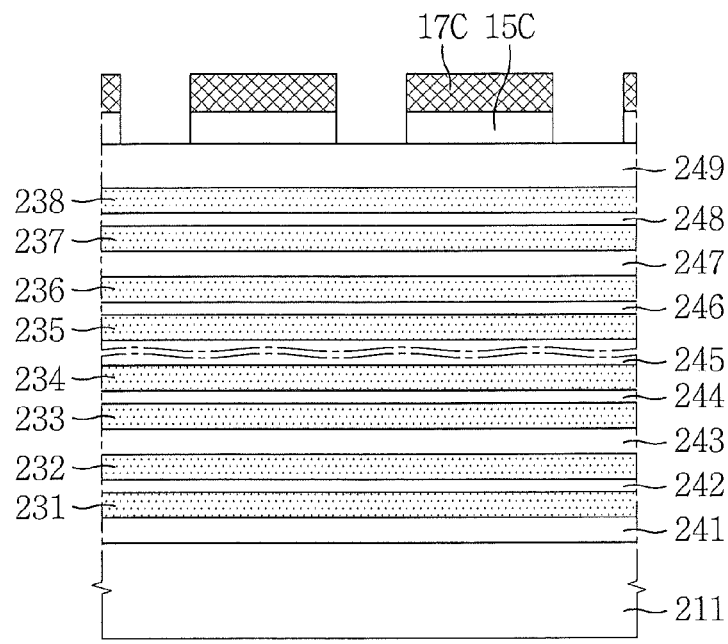

Referring to FIG. 34, the first mask pattern 18C may be removed.

Figure 35:
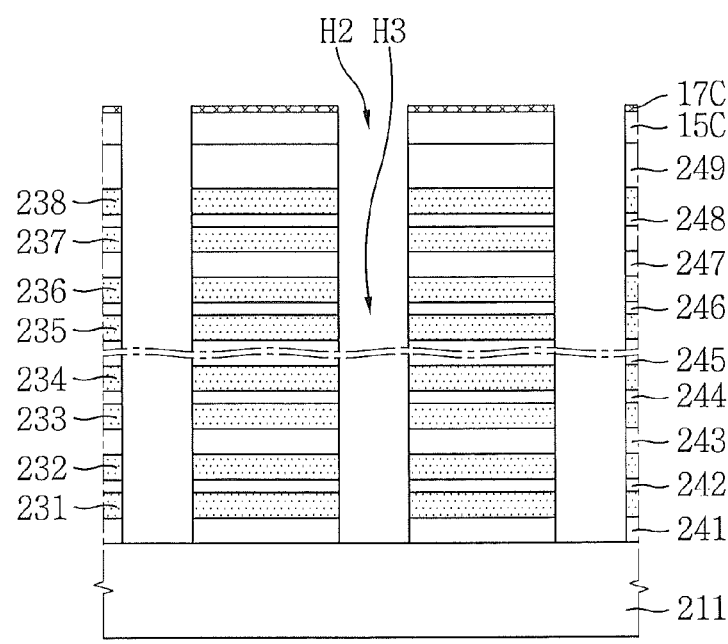

Referring to FIG. 35, a third opening H3 may be formed by patterning the first to ninth insulating layers 241, 242, 243, 244, 245, 246, 247, 248, and 249, and the first to eighth sacrificial layers 231, 232, 233, 234, 235, 236, 237, and 238, using the hardmask pattern 17C as an etch mask. The third opening H3 may have an aspect ratio of 20:1 or more. The third opening H3 may be a contact hole. The third opening H3 may be a channel hole.

Figure 36:
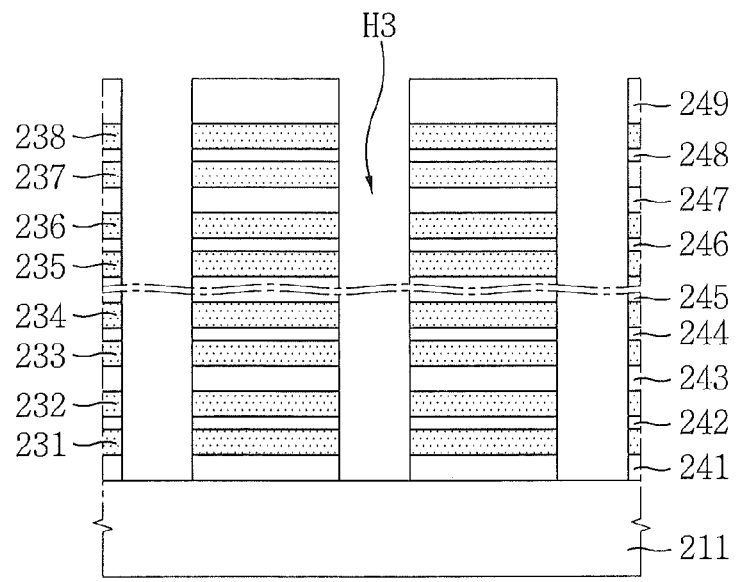

Referring to FIG. 36, the hardmask pattern 17C and the bowing control pattern 15C may be removed.

Figure 37:
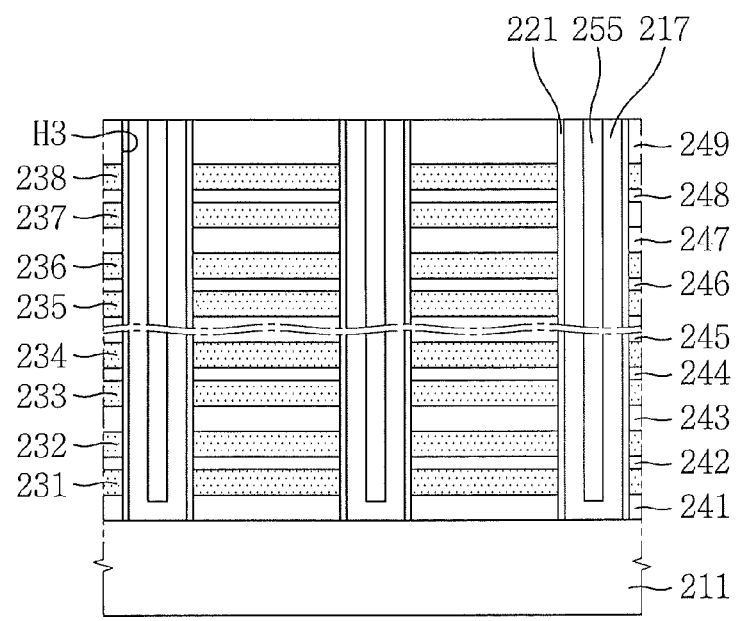

Referring to FIG. 37, a first charge trapping dielectric layer 221, a body 217, and an insulating core 255 may be formed in the third opening H3. The body 217 may surround a side surface and bottom of the insulating core 255. The body 217 may be in contact with the substrate 211. The first charge trapping dielectric layer 221 may be formed on a side surface of the body 217. The first charge trapping dielectric layer 221 may cover a sidewall of the third opening H3.

The first charge trapping dielectric layer 221 may include silicon oxide, silicon nitride, silicon oxynitride, a metal oxide, a metal silicate, or a combination thereof. For example, the first charge trapping dielectric layer 221 may include a structure in which a first silicon oxide, silicon nitride, and a second silicon oxide are sequentially stacked. The body 217 may include polysilicon or single crystalline silicon. The insulating core 255 may include silicon oxide, silicon nitride, silicon oxynitride, or a combination thereof.

Figure 38:
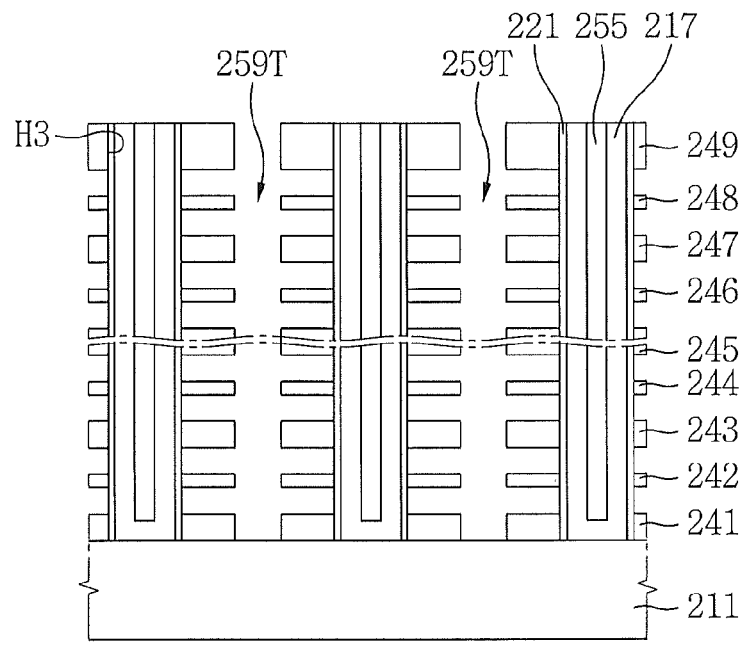

Referring to FIG. 38, a trench 259T may be formed by patterning the first to ninth insulating layers 241, 242, 243, 244, 245, 246, 247, 248, and 249, and the first to eighth sacrificial layers 231, 232, 233, 234, 235, 236, 237, and 238. The first to eight sacrificial layers 231, 232, 233, 234, 235, 236, 237, and 238 exposed in the trench 259T may be removed.

Figure 39:
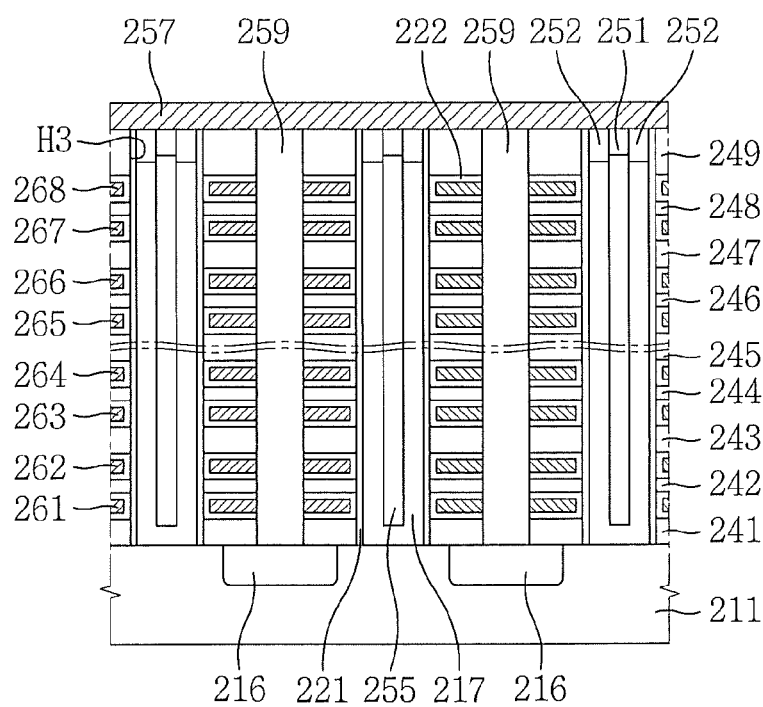

Referring to FIG. 39, first and second ground selection gate electrodes 261 and 262, first to fourth control gate electrodes 263, 264, 265, and 266, first and second string selection gate electrodes 267 and 268, a second charge trapping dielectric layer 222, a conductive plug 251, a source area 216, a drain area 252, a bit line 257, and a tenth insulating layer 259 may be formed.

The first and second ground selection gate electrodes 261 and 262, the first to fourth control gate electrodes 263, 264, 265, and 266, and the first and second string selection gate electrodes 267 and 268 may include a conductive material, such as a metal, a metal silicide, a metal nitride, polysilicon, or a combination thereof. The second charge trapping dielectric layer 222 may include silicon oxide, silicon nitride, silicon oxynitride, a metal oxide, a metal silicate, or a combination thereof. For example, the second charge trapping dielectric layer 222 may include AlO.

In other embodiments, the first charge trapping dielectric layer 221 and the second charge trapping dielectric layer 222 may be interpreted as a data storage element. In still other embodiments, the data storage element may include a resistance-change layer, a phase-change layer, a magnetic tunnel junction (MTJ), a polymer layer, or ferroelectrics.

Figure 40:
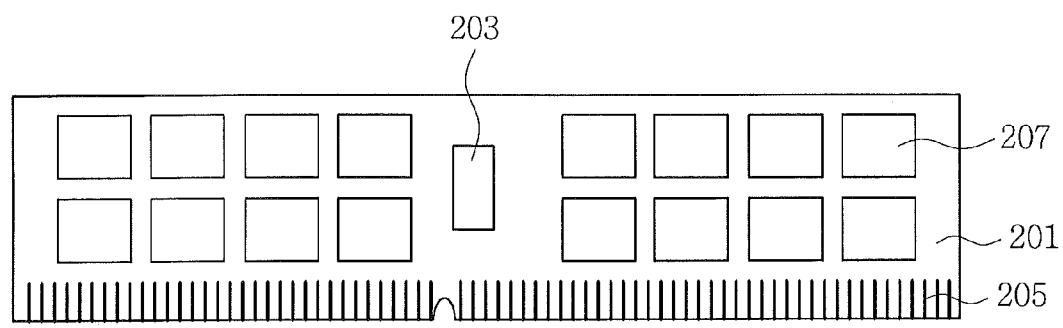
FIG. 40 is a layout for describing a semiconductor module in accordance with embodiments of the inventive concepts.

FIG. 40 is a layout showing a semiconductor module in accordance with embodiments of the inventive concepts.

Referring to FIG. 40, a semiconductor module in accordance with embodiments of the inventive concepts may include a module substrate 201, a plurality of semiconductor packages 207, and a control chip package 203. Input/output terminals 205 may be provided on the module substrate 201. At least one of the semiconductor packages 207 and/or the control chip package 203 may include a configuration as described with reference to FIGS. 1 to 39. The semiconductor packages 207 and the control chip package 203 may be installed on the module substrate 201. The semiconductor packages 207 and the control chip package 203 may be electrically connected to the input/output terminals 205 in series/parallel.

The control chip package 203 may be omitted. Each of the semiconductor packages 207 may include a volatile memory chip, such as a DRAM and a static random access memory (SRAM), a non-volatile memory chip, such as a flash memory, a phase change memory, a magnetic random access memory (MRAM), and/or a resistive random access memory (RRAM). The semiconductor module in accordance with embodiments of the inventive concepts may be a memory module.

Figure 41:
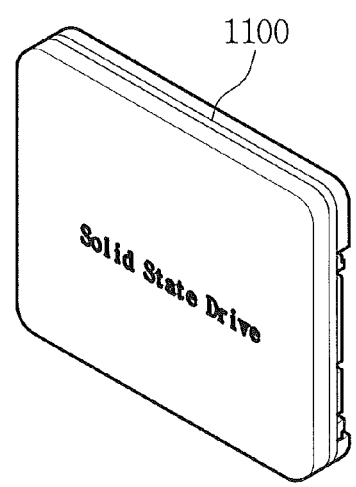
FIGS. 41 to 46 are perspective views and system block diagrams for describing electronic apparatuses in accordance with embodiments of the inventive concepts.
Figure 42:
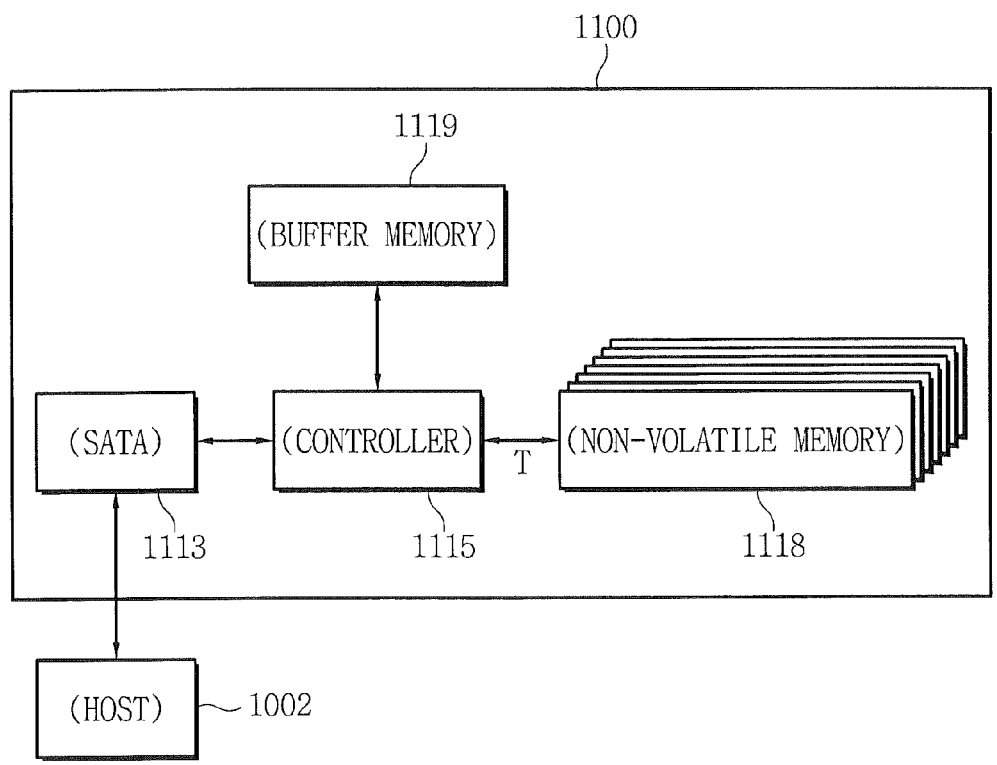

FIG. 41 is a perspective view showing an electronic apparatus in accordance with embodiments of the inventive concepts, and FIG. 42 is a system block diagram showing an electronic apparatus in accordance with embodiments of the inventive concepts. The electronic apparatus may be a data storage device such as a solid state drive (SSD) 1100.

Referring to FIGS. 41 and 42, the SSD 1100 may include an interface 1113, a controller 1115, a non-volatile memory 1118, and a buffer memory 1119. The SSD 1100 may be an apparatus that stores information using a semiconductor device. The SSD 1100 may be faster, may have a lower mechanical delay or failure rate, and may generate less heat and noise than a hard disk drive (HDD). Further, the SSD 1100 may be smaller and lighter than the HDD. The SSD 1100 may be used in a laptop computer, a netbook, a desktop PC, an MP3 player and/or a portable storage device.

The controller 1115 may be formed close to the interface 1113 and electrically connected thereto. The controller 1115 may be a microprocessor including a memory controller and a buffer controller. The non-volatile memory 1118 may be formed close to the controller 1115 and electrically connected thereto. Data storage capacity of the SSD 1100 may correspond to the capacity of the non-volatile memory 1118. The buffer memory 1119 may be formed close to the controller 1115 and electrically connected thereto.

The interface 1113 may be connected to a host 1002, and may send and receive electric signals, such as data. For example, the interface 1113 may be a device using a standard such as a Serial Advanced Technology Attachment (SATA), an Integrated Drive Electronics (IDE) and/or a Small Computer System Interface (SCSI). The non-volatile memory 1118 may be connected to the interface 1113 via the controller 1115. The non-volatile memory 1118 may function to store data received through the interface 1113. Even when power supplied to the SSD 1100 is interrupted, the data stored in the non-volatile memory 1118 may be retained.

The buffer memory 1119 may include a volatile memory. The volatile memory may be a dynamic random access memory (DRAM) and/or a static random access memory (SRAM). The buffer memory 1119 has a relatively faster operating speed than the non-volatile memory 1118.

Data processing speed of the interface 1113 may be relatively faster than the operating speed of the non-volatile memory 1118. Here, the buffer memory 1119 may function to temporarily store data. The data received through the interface 1113 may be temporarily stored in the buffer memory 1119 via the controller 1115, and then permanently stored in the non-volatile memory 1118 according to the data write speed of the non-volatile memory 1118. Further, frequently-used items of the data stored in the non-volatile memory 1118 may be pre-read and temporarily stored in the buffer memory 1119. That is, the buffer memory 1119 may function to increase effective operating speed of the SSD 1100, and reduce an error rate.

The controller 1115, the buffer memory 1119, the non-volatile memory 1118 and/or the interface 1113 may have a configuration as described with reference to FIGS. 1 to 39.

Figure 43:
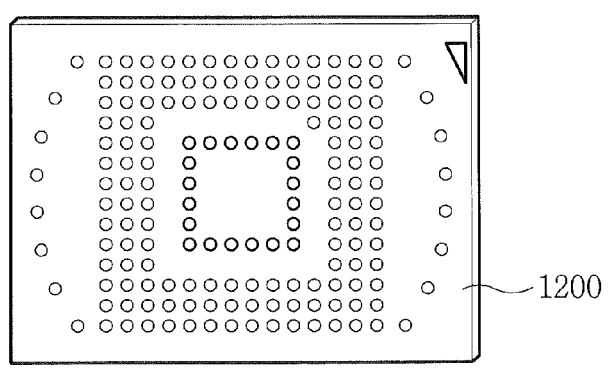
Figure 44:
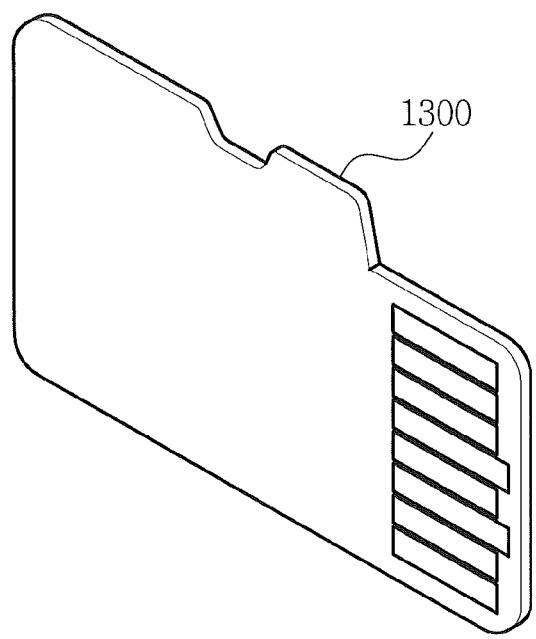
Figure 45:
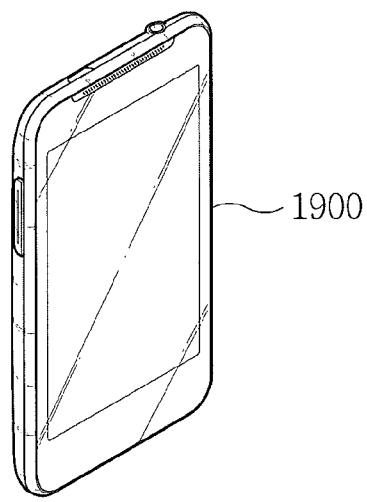
Figure 46:
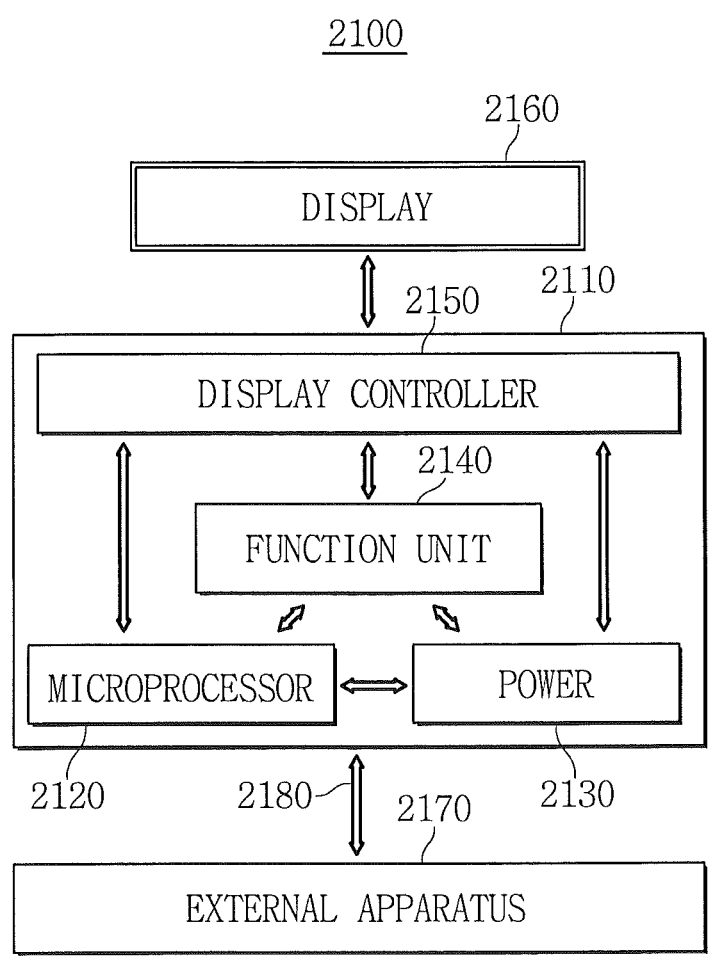

FIGS. 43 to 45 are perspective views showing electrical apparatuses in accordance with embodiments of the inventive concepts, and FIG. 46 is a system block diagram showing electrical apparatuses in accordance with embodiments of the inventive concepts.

Referring to FIGS. 43 to 45, the semiconductor device described with reference to FIGS. 1 to 39 may be usefully applied to electronic systems, such as an embedded multimedia chip (eMMC) 1200, a micro SD 1300, a smart phone 1900, a netbook, a laptop computer and/or a tablet PC. For example, the semiconductor device as described with reference to FIGS. 1 to 39 may be installed in a mainboard of the smart phone 1900. The semiconductor device as described with reference to FIGS. 1 to 39 may be provided to an expansion apparatus, such as the micro SD 1300, to be used combined with the smart phone 1900.

Referring to FIG. 46, the semiconductor device as described with reference to FIGS. 1 to 39 may be applied to an electronic system 2100. The electronic system 2100 may include a body 2110, a microprocessor unit 2120, a power unit 2130, a function unit 2140, and a display controller unit 2150. The body 2110 may be a motherboard formed of a printed circuit board (PCB). The microprocessor unit 2120, the power unit 2130, the function unit 2140, and the display controller unit 2150 may be installed on the body 2110. A display unit 2160 may be arranged the inside or outside of the body 2110. For example, the display unit 2160 may be arranged on a surface of the body 2110 and display an image processed by the display controller unit 2150.

The power unit 2130 may receive a constant voltage from an external battery (not shown), etc., divide the voltage into various levels, and supply those voltages to the microprocessor unit 2120, the function unit 2140, and the display controller unit 2150, etc. The microprocessor unit 2120 may receive a voltage from the power unit 2130 to control the function unit 2140 and the display unit 2160. The function unit 2140 may perform various functions of the electronic system 2100. For example, when the electronic system 2100 is a smart phone, the function unit 2140 may have several components which perform functions of the mobile phone such as output of an image to the display unit 2160 or output of a voice to a speaker, by dialing or communication with an external apparatus 2170. If a camera is installed, the function unit 2140 may function as a camera image processor.

In the embodiment to which the inventive concepts is applied, when the electronic system 2100 is connected to a memory card, etc. in order to expand capacity, the function unit 2140 may be a memory card controller. The function unit 2140 may exchange signals with the external apparatus 2170 through a wired or wireless communication unit 2180. In addition, when the electronic system 2100 needs a universal serial bus (USB), etc. in order to expand functionality, the function unit 2140 may function as an interface controller. Further, the function unit 2140 may include a mass storage apparatus.

The semiconductor device as described with reference to FIGS. 1 to 39 may be applied to the function unit 2140, the microprocessor unit 2120 and/or any of the other elements of FIG. 46.

According to the embodiments of the inventive concepts, a profile of an opening having a high aspect ratio of 20:1 or more may be very efficiently controlled using a combination of a bowing control pattern and a hardmask pattern. The thickness of the hardmask pattern may be significantly reduced compared to a thickness. A desired profile of the opening may be implemented using the bowing control pattern. The opening may have a uniform size and shape over the entire surface. A semiconductor device having high aspect ratio may be implemented.

The foregoing is illustrative of embodiments and is not to be construed as limiting thereof. Although a few embodiments have been described, those skilled in the art will readily appreciate that many modifications are possible without materially departing from the novel teachings and advantages. Accordingly, all such modifications are intended to be included within the scope of these inventive concepts as defined in the claims. In the claims, means-plus-function clauses are intended to cover the structures described herein as performing the recited function, and not only structural equivalents but also equivalent structures.

What is claimed is:

1. A method of forming a semiconductor device, the method comprising:
    forming an intermediate layer on a substrate;
    forming a bowing control layer on the intermediate layer;
    forming a hardmask pattern having a thickness of about 0.17 times the intermediate layer or less on the bowing control layer, wherein the hardmask pattern has a first opening, and the bowing control layer has a second opening connected to the first opening; and
    forming a third opening passing through the intermediate layer, connected to the second opening and having an aspect ratio of about 20:1 or more,
    wherein the bowing control layer comprises a different material from the hardmask pattern, and includes a first edge on a lower end of the second opening, a second edge on the lower end of the second opening and facing the first edge, and a third edge on an upper end of the second opening, and
    wherein when a first point on the first edge, a second point on the second edge, and a third point located on a horizontal line passing through the third edge are defined, an intersecting angle between a first side from the first point to the second point, and a second side from the second point to the third point is from about 50° to about 80° when an intersecting angle between the first side and a third side from the first point to the third point is about 90°.

2. The method of claim 1, wherein when first to fourth quartiles are defined on a sidewall of the third opening, a straight line passing the first quartile and the third quartile is spaced apart from the fourth quartile, and the fourth quartile is located on an upper edge of the intermediate layer.

3. The method of claim 2, wherein a distance between the fourth quartile and the straight line is about 0.05 times a width of the third opening or less.

4. The method of claim 1, wherein when first to fourth quartiles are defined on a sidewall of the third opening, a first straight line passing the first quartile and the third quartile is in contact with the fourth quartile, and the fourth quartile is located on an upper edge of the intermediate layer.

5. The method of claim 1, wherein the bowing control layer includes a material having an opposite stress to the hardmask pattern.

6. The method of claim 5, wherein the hardmask pattern includes a W layer, and the bowing control layer includes a Ti layer, a TiN layer, a Ta layer, an AlN layer, an AlO layer, a TaO layer, an undoped Si layer and/or a doped Si layer.

7. The method of claim 5, wherein the hardmask pattern includes a Ti layer, a TiN layer, an AlN layer, an AlO layer and/or a TaO layer, and the bowing control layer includes an undoped Si layer and/or a doped Si layer.

8. The method of claim 5, wherein the hardmask pattern includes a C-doped Si layer and/or a B-doped Si layer, and the bowing control layer includes a W layer, a TiN layer and/or an undoped Si layer.

9. The method of claim 1, wherein the bowing control layer includes a different material from an uppermost layer of the intermediate layer.

10. The method of claim 1, wherein a thickness of the hardmask pattern is about 0.01 to about 0.17 times that of the intermediate layer.

11. The method of claim 1, wherein the intermediate layer includes two or more alternately stacked different materials.

12. The method of claim 1, wherein the forming of the bowing control layer and the hardmask pattern includes:
    forming the bowing control layer on the intermediate layer;
    forming a hardmask layer on the bowing control layer;
    forming a mask layer on the hardmask layer;
    forming a photoresist pattern on the mask layer;
    forming a mask pattern by patterning the mask layer using the photoresist pattern;
    removing the photoresist pattern; and
    sequentially patterning the hardmask layer and the bowing control layer using the mask pattern.

13. The method of claim 1, further comprising:
    forming a plug in the third opening.

14. A method of forming a semiconductor device, the method comprising:
    forming an intermediate layer on a substrate;
    forming a bowing control layer on the intermediate layer;
    forming a hardmask pattern having a thickness of about 0.17 times the intermediate layer or less on the bowing control layer, wherein the hardmask pattern has a first opening, and the bowing control layer has a second opening connected to the first opening; and forming a third opening passing through the intermediate layer, connected to the second opening and having an aspect ratio of about 20:1 or more, wherein the bowing control layer comprises a different material from the hardmask pattern, and includes a material having an opposite stress to the hardmask pattern, the hardmask pattern comprises a W layer, a Ti layer, a TiN layer, an AlN layer, an AlO layer, a TaO layer, a C-doped Si layer and/or a B-doped Si layer, and the bowing control layer comprises a Ti layer, a TiN layer, a Ta layer, an AlN layer, an AlO layer, a TaO layer, an undoped Si layer, a doped Si layer, and/or a W layer.

15. The method of claim 14, wherein the bowing control layer includes a first edge on a lower end of the second opening, a second edge on the lower end of the second opening and facing the first edge, and a third edge on an upper end of the second opening, and when a first point on the first edge, a second point on the second edge, and a third point located on a horizontal line passing through the third edge are defined, an intersecting angle between a first side from the first point to the second point, and a second side from the second point to the third point is from about 50° to about 80° when an intersecting angle between the first side and a third side from the first point to the third point is about 90°.

16. A method of forming a semiconductor device, the method comprising:

forming an intermediate layer on a substrate;

forming a bowing control layer on the intermediate layer;

forming a hardmask layer having a thickness of about 0.17 times the intermediate layer or less on the bowing control layer;

forming a capping mask pattern on the hardmask layer by a first etching process;

forming a hardmask pattern having a first opening, and a bowing control pattern having a second opening connected to the first opening, by a second etching process on the hardmask layer and the bowing control layer, respectively, using the capping mask pattern as an etch mask; and forming a third opening passing through the intermediate layer, connected to the second opening and having an aspect ratio of about 20:1 or more, by a third etching process, wherein the bowing control pattern comprises a different material from the hardmask pattern.

17. The method of claim 16, wherein the second etching process is performed in a different chamber from the first etching process, and the third etching process is performed in a different chamber from the second etching process.

18. The method of claim 16, wherein the bowing control layer includes a material having an opposite stress to the hardmask layer.

19. The method of claim 16, wherein the hardmask layer comprises a W layer, a Ti layer, a TiN layer, an AlN layer, an AlO layer, a TaO layer, a C-doped Si layer, and/or a B-doped Si layer, and the bowing control pattern comprises a Ti layer, a TiN layer, a Ta layer, an AlN layer, an AlO layer, a TaO layer, an undoped Si layer, a doped Si layer, and/or a W layer.

20. The method of claim 16, wherein the bowing control pattern includes a first edge on a lower end of the second opening, a second edge on the lower end of the second opening and facing the first edge, and a third edge on an upper end of the second opening, and when a first point on the first edge, a second point on the second edge, and a third point located on a horizontal line passing through the third edge are defined, an intersecting angle between a first side from the first point to the second point, and a second side from the second point to the third point is from about 50° to about 80° when an intersecting angle between the first side and a third side from the first point to the third point is about 90°.

21. A method of forming a semiconductor device, the method comprising:

forming an intermediate layer on a substrate; and forming a contact hole passing through the intermediate layer and having an aspect ratio of about 20:1 or more, such that when first to fourth quartiles are defined on a sidewall of the contact hole, the fourth quartile is located on an upper edge of the contact hole, and a straight line passing the first quartile and the third quartile is spaced apart from the fourth quartile, a distance between the fourth quartile and the straight line is about 0.05 times a width of the contact hole or less.

22. The method of claim 21, further comprising:

forming a conductive plug in the contact hole, such that the first to fourth quartiles are in contact with the conductive plug, and a distance between the fourth quartile and the straight line is about 0.05 times a width of the conductive plug or less.

23. The method of claim 21, further comprising:

forming a lower electrode in the contact hole;

forming a capacitor dielectric layer on the lower electrode; and forming an upper electrode on the capacitor dielectric layer.

24. The method of claim 21, further comprising:

forming a conductive pattern in the contact hole; and forming a data storage element connected to the conductive pattern, wherein the intermediate layer includes a plurality of vertically stacked gate electrodes, the contact hole passes through the gate electrodes, and the data storage element is disposed between the conductive pattern and the gate electrodes.

25. The method of claim 24, wherein the data storage element includes a charge trapping dielectric layer, a resistance-change layer, a phase-change layer, a magnetic tunnel junction (MTJ), a polymer layer and/or ferroelectrics.

* * * * *